United States Patent
Audzeyeu et al.

(10) Patent No.: US 8,378,407 B2
(45) Date of Patent: Feb. 19, 2013

(54) FLOATING GATE INVERTER TYPE MEMORY CELL AND ARRAY

(75) Inventors: Mikalai Audzeyeu, Minsk (BY); Yuriy Makarevich, Minsk (BY); Siarhei Shvedau, Minsk (BY); Anatoly Belous, Minsk (BY); Evgeny Pikhay, Haifa (IL); Vladislav Dayan, Timrat (IL); Yakov Roizin, Afula (IL)

(73) Assignee: Tower Semiconductor, Ltd., Migdal Haemek (IL)

(*) Notice: Subject to any disclaimer, the term of this patent is extended or adjusted under 35 U.S.C. 154(b) by 237 days.

(21) Appl. No.: 12/715,762

(22) Filed: Mar. 2, 2010

(65) Prior Publication Data
US 2010/0157669 A1 Jun. 24, 2010

Related U.S. Application Data

(63) Continuation-in-part of application No. 11/936,718, filed on Nov. 7, 2007, now Pat. No. 7,700,994.

(60) Provisional application No. 60/869,081, filed on Dec. 7, 2006.

(51) Int. Cl.
*H01L 29/788* (2006.01)

(52) U.S. Cl. ............... 257/315; 257/322; 257/E27.102

(58) Field of Classification Search ................ 257/315, 257/322, E27.102
See application file for complete search history.

(56) References Cited

U.S. PATENT DOCUMENTS

| | | | |
|---|---|---|---|
| 5,272,368 A | 12/1993 | Turner et al. | |
| 5,619,942 A | 4/1997 | Stewart et al. | |
| 5,912,509 A | 6/1999 | Kasai et al. | |
| 6,146,939 A | 11/2000 | Dasgupta | |
| 6,483,139 B1 | 11/2002 | Arimoto et al. | |
| 6,489,650 B2 | 12/2002 | Kumazaki | |
| 6,788,576 B2 | 9/2004 | Roizin | |
| 6,818,943 B2 | 11/2004 | Kumazaki | |
| 6,842,327 B1 | 1/2005 | Diorio et al. | |
| 7,339,829 B2 | 3/2008 | Sarig | |
| 2004/0212014 A1* | 10/2004 | Fujito et al. | 257/355 |
| 2006/0033141 A1 | 2/2006 | Okazaki et al. | |
| 2006/0289923 A1 | 12/2006 | Jones | |
| 2007/0166912 A1 | 7/2007 | Fenigstein et al. | |
| 2007/0279987 A1 | 12/2007 | Fang et al. | |

OTHER PUBLICATIONS

Chang, Ted et al. "A Low Voltage, Low Power P-Channel EEPROM Cell for Embedded and System-On-A-Chip Applications", Date Unknown, pp. 1-4.

(Continued)

*Primary Examiner* — Phat X Cao
(74) *Attorney, Agent, or Firm* — Bever, Hoffman & Harms, LLP; E. Eric Hoffman

(57) ABSTRACT

A non-volatile memory (NVM) cell and array includes a control capacitor, tunneling capacitor, CMOS inverter and output circuit. The CMOS inverter includes PMOS and NMOS inverter transistors. The control capacitor, tunneling capacitor and PMOS and NMOS inverter transistors share a common floating gate, which is programmed/erased by Fowler-Nordheim tunneling. The output circuit includes PMOS and NMOS select transistors. The PMOS inverter and select transistors share a common source/drain region. Similarly, the NMOS inverter and select transistors share a common source/drain region. This configuration minimizes the required layout area of the non-volatile memory cell and allows design of arrays with smaller footprints. Alternately, the tunneling capacitor may be excluded, further reducing the required layout area of the NVM cell. In this case, the NMOS inverter transistor functions as a tunneling capacitor for programming and erasing the cell, and the PMOS inverter transistor functions as a tunneling capacitor for erasing the cell.

21 Claims, 16 Drawing Sheets

OTHER PUBLICATIONS

Kwok, Al "An Innovative NVM Technology for Sub-0.25um SOC Applications", Programmable Microelectronics Corp. (PMC) Flash, CASPA/CIE System-on-Chip (SOC) Symposium, May 16, 1998, pp. 1-24.

Lee, Nae-In et al. "High-Performance EEPROMs Using N- and P-Channel Polysilicon Thin-Film Transistors With Electron Cyclotron Resonance N2O-Plasma Oxide", IEEE Electron Device Letters, vol. 20, No. 1, Jan. 1999, pp. 15-17.

Buchanan, D. A. "Scaling the Gate Dielectric: Materials, Integration and Reliability", IBM J. Res. Develop., vol. 43, No. 3, May 1999, pp. 245-264.

Wolf, Stanley and Richard N. Tauber "Silicon Processing for the VLSI Era", vol. 1: Process Technology, Second Edition, pp. 342-344 (4 pages including book cover), Date Unknown.

* cited by examiner

FLOATING GATE INVERTER TYPE MEMORY CELL AND ARRAY

RELATED APPLICATIONS

This application is a continuation in part of U.S. patent application for "Single Poly CMOS Logic Memory Cell For RFID Application And Its Programming And Erasing Method", U.S. application Ser. No. 11/936,718, filed Nov. 7, 2007, which claims priority of U.S. Provisional patent application for "Single Poly CMOS Logic Memory Cell For RFID Application And Its Programming And Erasing Method", U.S. App. Ser. No. 60/869,081, filed Dec. 7, 2006.

FIELD OF THE INVENTION

This invention relates to complimentary metal-oxide-silicon (CMOS) integrated circuit (IC) devices, and more particularly to memories for passive radio frequency identification (RFID) CMOS IC devices and other mobile applications.

RELATED ART

It is desirable for embedded non-volatile memory devices to exhibit low power consumption in all operational states: programming, erasing, and readout. In particular applications (e.g., RFID), the currents utilized to facilitate the operational states of the non-volatile memory should typically not exceed 100 nA per cell (especially during flash erase operations), while the program/erase times must be relatively short (less than several milliseconds). It is also desirable for read-out operations to be performed at low voltages (i.e., at a level of 1 Volt or below), because otherwise, power-consuming additional charge pumps may be required in the chip design. Moreover, it is desirable for embedded non-volatile memory device to be inexpensive to manufacture (i.e., not requiring additional masks or process steps in addition to a core CMOS process flow). Several types of memory cells that have attempted to meet these requirements are summarized below.

A memory cell that uses a CMOS inverter principle for readout and is programmed and erased by Fowler-Nordheim (F-N) tunneling mechanism is disclosed in U.S. Patent Application 2008/0137408 by Roizin et al., entitled "Single Poly CMOS Logic Memory Cell For RFID Application And Its Programming And Erasing Method" (hereinafter referred to as "Roizin et al."). This memory cell contains a single poly floating gate structure (130). A first region (130-1) of the floating gate is located over a control gate formed by an active area of a first isolated P-well (IPW1). A second region (130-2) of the floating gate is located over a tunneling gate formed by an active area of a second isolated P-well (IPW2). Using separate isolated P-wells allows program/erase voltages to be divided between the control and tunneling gates, thus eliminating the need for special transistors to transfer high voltages during the program/erase operations, and avoiding gate induced drain leakage (GIDL) in peripheral circuitry. A third region (130-3) and a fourth region (130-4) of the floating gate are used to form a p-channel transistor (110) and an n-channel transistor (120), respectively, thereby forming an inverter (104) through which data is read from the memory cell.

Another memory cell that uses a CMOS inverter principle for readout and is programmed and erased by F-N tunneling mechanism is disclosed in U.S. Pat. No. 7,339,829 to Sarig, entitled "Ultra Low Power Non-Volatile Memory Module" (hereinafter referred to as "Sarig"). This memory cell includes a pass gate circuit (280), which includes an n-channel transistor (380) and a p-channel transistor (381) connected in parallel to the output of the memory cell. The pass gate circuit allows read operations to be performed at reduced voltages, because there is no voltage drop across the transistors of the pass gate circuit.

Another memory cell that uses a CMOS inverter principle for readout and is programmed and erased by F-N tunneling mechanism is disclosed in U.S. Pat. No. 5,272,368 to Turner et al., entitled "Complementary Low Power Non-Volatile Reconfigurable EEcell" (hereinafter referred to as "Turner et al."). This memory cell contains a single poly floating gate (12) located over a control gate (10) formed by a first n-doped region (91), and over a tunneling gate (13) formed by a second n-doped region (92). This memory cell includes a CMOS inverter (45) which provides a read output value in response to the charge stored on the floating gate.

The above-mentioned memory cells exhibit very low read currents, due to utilization of the CMOS inverter read-out principle. Roizin et al. and Sarig exhibit ultra-low programming and erasing currents due to the implemented F-N tunneling mechanism. The memory cells of Roizin et al. and Sarig may be operated as EEPROM cells, because the program and erase voltages are divided between the control and tunneling gates, thus allowing the cross-wise cell selection.

Despite the mentioned advantages, Roizin et al. and Sarig undesirably require a relatively large layout area per cell, while Turner et al. does not allow for ultra-low power operation and requires special circuitry to transfer high voltages for programming. These limitations become pronounced when high volumes of logic memory cells are requested. It would therefore be desirable to have an improved memory structure that does not exhibit the above-described deficiencies.

It would therefore be desirable to have an ultra-low power non-volatile memory cell that avoids the problems associated with the prior art structures discussed above. In particular, what is needed is an electrically erasable/programmable single poly CMOS logic memory cell that operates at both the low voltages and low currents associated with passive RFID applications, but does not require excessive layout area.

SUMMARY

Accordingly, the present invention provides a non-volatile memory cell that is fabricated in accordance with a single-poly CMOS logic process. In accordance with a first embodiment, a non-volatile memory cell of the present invention includes a floating gate, which supports a control capacitor, a tunnel capacitor and a floating gate (FG) CMOS inverter structure for implementing read operations. The floating gate CMOS inverter structure includes a pull-up transistor having a source coupled to a pull-up voltage supply, and a pull-down transistor having a source coupled to a pull-down voltage supply. The floating gate forms the gate electrodes of the pull-up and pull-down transistors. The drain of the pull-up transistor is connected directly to a first select transistor, and the drain of the pull-down transistor is connected directly to a second select transistor, such that the drains of the pull-up and pull-down transistors are not directly connected to one another. By eliminating the common connection between the drains of the pull-up and pull-down transistors, the resulting non-volatile memory cell advantageously eliminates a pair of contacts that are required in conventional non-volatile memory cells that use the CMOS inverter principle for readout. The elimination of these contacts allows for an improved layout of the non-volatile memory cells in an array, such that the array exhibits a relatively small layout area.

In one variation, the memory cell is fabricated in a semiconductor substrate having a first conductivity type. The control capacitor and the tunnel capacitor of the memory cells are fabricated in isolated well regions of the first conductivity type, which in turn, are fabricated in deep well regions of a second conductivity type. In another variation, the control capacitor and the tunnel capacitor are fabricated in well regions of the second conductivity type, without requiring deep well structures.

In accordance with a second embodiment, a non-volatile memory cell of the present invention includes a floating gate, which supports a control capacitor and a floating gate (FG) CMOS inverter structure for implementing program, erase and read operations. The floating gate CMOS inverter structure includes a PMOS pull-up transistor and an NMOS pull-down transistor. The PMOS pull-up transistor is fabricated in an n-well region, which in turn, is fabricated in a first deep n-well region. The NMOS pull-down transistor is fabricated in a first isolated p-well region, which is fabricated in the first deep n-well region. The control capacitor includes a counter-electrode implemented by a second isolated p-well region, which is fabricated in a second deep n-well region. Program and erase operations are performed by F-N tunneling, by applying program and erase voltages to the first and second isolated p-well regions. Advantageously, a dedicated tunnel capacitor is not required by the second embodiment, thereby minimizing the required memory cell layout area.

The memory cells of the present invention can be used in various applications, including, but not limited to RFID (radio frequency identification) and mobile applications of future generations, due to growing demand to the memory volume.

The present invention will be more fully understood in view of the following description and drawings.

DETAILED DESCRIPTION

First Embodiment

Figure 1A:
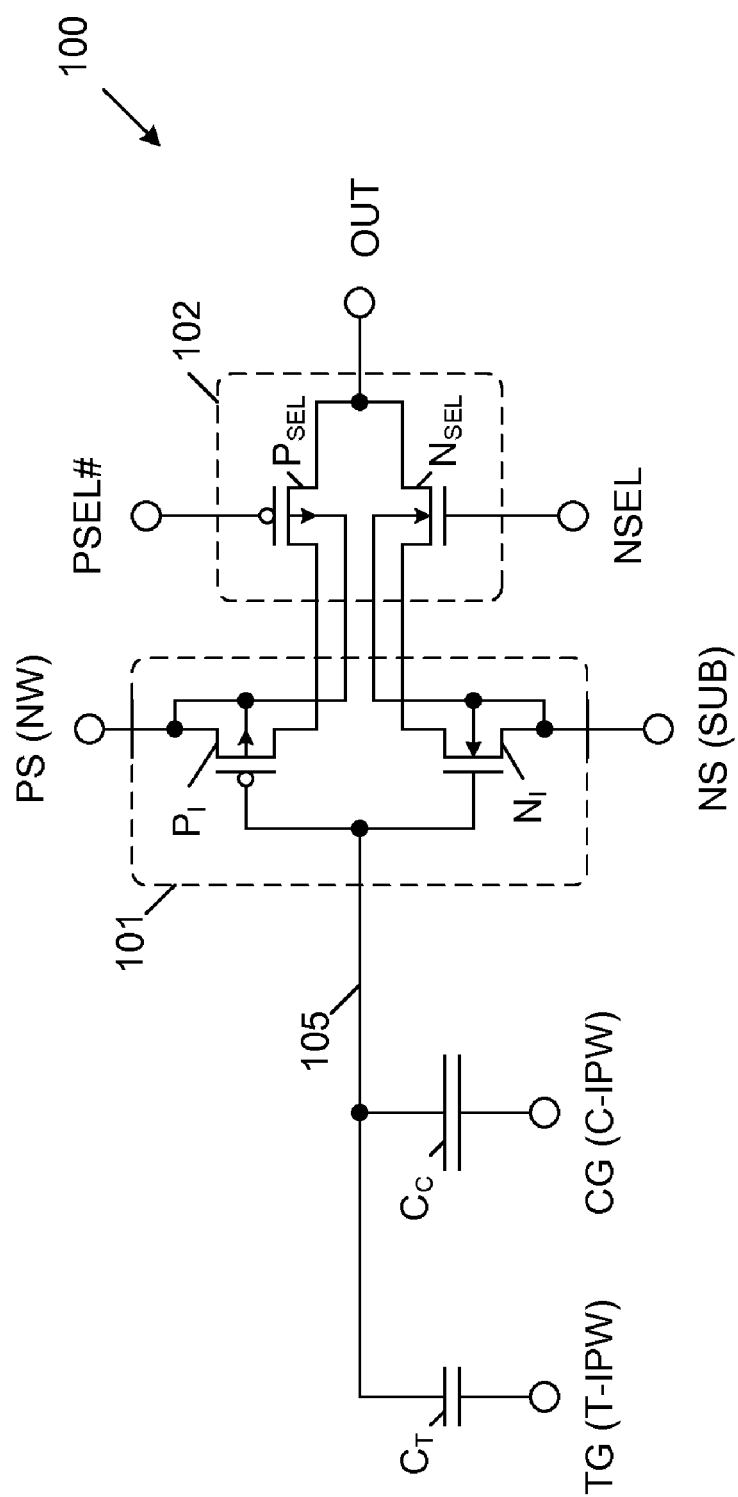
FIG. 1A is a circuit diagram of a single-poly non-volatile memory cell in accordance with a first embodiment of the present invention.

FIG. 1A is a circuit diagram of a single-poly non-volatile memory cell 100 in accordance with a first embodiment of the present invention. Memory cell 100 includes tunnel capacitor $C_T$, control capacitor $C_C$, CMOS inverter circuit 101, and read output circuit 102. CMOS inverter circuit 101 includes PMOS pull-up transistor $P_I$ and NMOS pull-down transistor $N_I$. Read output circuit 102 includes PMOS select transistor $P_{SEL}$ and NMOS select transistor $N_{SEL}$. Tunnel capacitor $C_T$, control capacitor $C_C$, PMOS pull-up transistor $P_I$ and NMOS pull-down transistor $N_I$ share a common floating gate electrode 105. That is, floating gate electrode 105 forms the gates of PMOS pull-up transistor $P_I$ and NMOS pull-down transistor $N_I$, and also forms the electrodes of tunnel capacitor $C_T$ and control capacitor $C_C$. In the described embodiments, floating gate electrode 105 is conductively doped polysilicon, which is fabricated in accordance with a conventional single-poly CMOS logic process. The counter-electrodes of tunnel capacitor $C_T$ and control capacitor $C_C$ are coupled to tunnel gate terminal TG and control gate terminal CG, respectively.

PMOS transistor $P_I$ has a source region and a body region (e.g., an n-well region) commonly coupled to an inverter pull-up terminal PS(NW). The body region of PMOS select transistor $P_{SEL}$ is also coupled to the inverter pull-up terminal PS(NW). NMOS transistor $N_I$ has a source region and a body region (e.g., a p-type substrate) commonly coupled to an inverter pull-down terminal NS(SUB). The body region of NMOS select transistor $N_{SEL}$ is also coupled to the inverter pull-down terminal NS(SUB).

The drain of PMOS pull-up transistor $P_I$ is coupled directly to the source of PMOS select transistor $P_{SEL}$. In one embodiment, PMOS transistors $P_I$ and $P_{SEL}$ share a common continuous p-type source/drain region within an associated n-well region.

Similarly, the drain of NMOS pull-down transistor $N_I$ is coupled directly to the source of NMOS select transistor $N_{SEL}$. In one embodiment, NMOS transistors $N_I$ and $N_{SEL}$ share a common continuous n-type source/drain region within a p-type substrate.

The drains of select transistors $P_{SEL}$ and $N_{SEL}$ are commonly connected to an output terminal OUT. The gates of select transistors $P_{SEL}$ and $N_{SEL}$ are coupled to output select terminals PSEL# and NSEL, respectively.

Figure 1B:
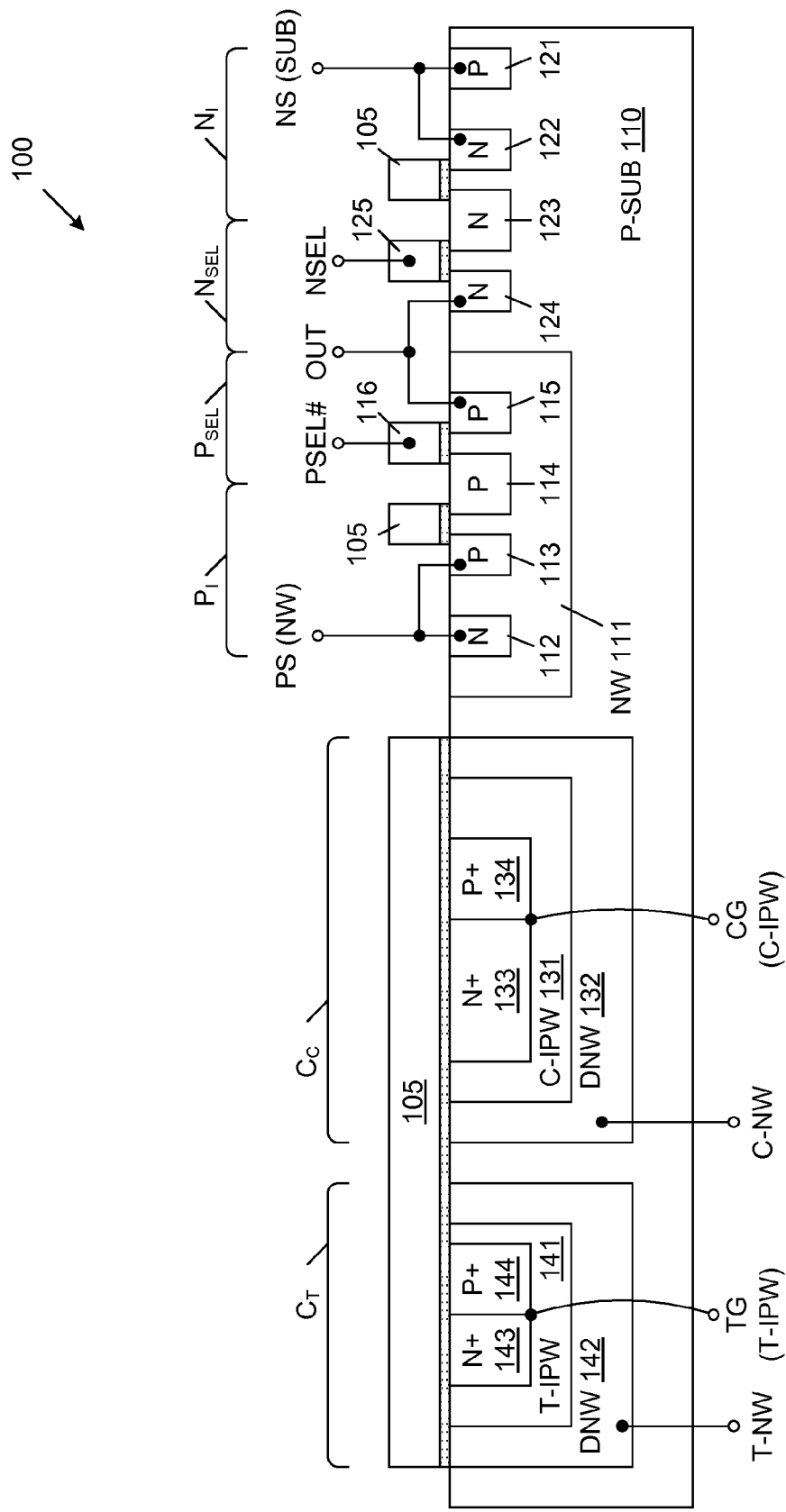
FIG. 1B is a simplified conceptual cross-sectional view of the various elements of the memory cell of FIG. 1A in accordance with one embodiment of the present invention.

FIG. 1B is a conceptual cross-sectional view of the various elements of memory cell 100 in accordance with one embodiment of the present invention. Although floating gate 105 is illustrated in three separate pieces in the view of FIG. 1B, it is understood that floating gate 105 is a single continuous piece, which is joined at locations outside the view of FIG. 1B. Moreover, it is understood that certain convention structures typically available in conventional CMOS processes, such as dielectric sidewall spacers, lightly doped source/drain regions and silicide structures, which are not illustrated in FIG. 1B, may be included in memory cell 100 in various embodiments.

In the embodiment illustrated by FIG. 1B, memory cell 100 is fabricated in a p-type semiconductor substrate (P-SUB) 110. NMOS transistors $N_I$ and $N_{SEL}$ are fabricated in p-type substrate 110. In an alternate embodiment, NMOS transistors $N_I$ and $N_{SEL}$ may be fabricated in a p-well region located within a deep n-well in the p-type substrate 110. As illustrated in FIG. 1B, NMOS transistor $N_I$ includes n-type source region 122 and n-type source/drain region 123 (which forms the drain of NMOS transistor $N_I$). Floating gate 105 extends over the channel region that exists between n-type source/drain regions 122-123. Note that a dielectric region separates floating gate 105 from the underlying semiconductor regions.

NMOS select transistor $N_{SEL}$ includes n-type source/drain region 123, which forms the source of NMOS transistor $N_{SEL}$) and n-type drain region 124. A polysilicon select gate 125 extends over the channel region that exists between n-type source/drain regions 123-124. A dielectric region separates select gate 125 from the underlying semiconductor regions. Select gate 125 is coupled to the select terminal NSEL of memory cell 100.

NMOS transistors $N_I$ and $N_{SEL}$ share the continuous n-type source/drain region 123, which advantageously reduces the required layout area of these transistors $N_I$ and $N_{SEL}$ (and thereby the required layout area of memory cell 100).

P-type contact region 121, which is located in p-type substrate 110, is connected to n-type source region 122 of NMOS transistor $N_I$, and to the inverter pull-down terminal NS(SUB) of memory cell 100.

PMOS transistors $P_I$ and $P_{SEL}$ are fabricated in an n-well (NW) region 111. PMOS transistor $P_I$ includes p-type source region 113 and p-type source/drain region 114 (which forms the drain of PMOS transistor $P_I$). Floating gate 105 extends over the channel region that exists between p-type source/drain regions 113-114. Again, a dielectric region separates floating gate 105 from the underlying semiconductor regions.

PMOS select transistor $P_{SEL}$ includes p-type source/drain region 114 (which forms the source of PMOS transistor $P_{SEL}$) and p-type drain region 115. A polysilicon select gate 105 extends over the channel region that exists between p-type source/drain regions 114-115. A dielectric region separates select gate 105 from the underlying semiconductor regions. Select gate 105 is coupled to the select terminal PSEL# of memory cell 100.

PMOS transistors $P_I$ and $P_{SET}$ share the continuous p-type source/drain region 114, which advantageously reduces the required layout area of these transistors $P_I$ and $P_{SEL}$ (and thereby the required layout area of memory cell 100).

N-type contact region 112, which is located in n-well region 111, is connected to p-type source region 113 of PMOS transistor $P_I$, and to the inverter pull-up terminal PS(NW) of memory cell 100.

As described above in connection with FIG. 1A, floating gate 105 forms the electrodes of tunnel capacitor $C_T$ and control capacitor $C_C$. The counter-electrode of control capacitor $C_C$ is formed by an active area that includes n-type region 133 and p-type region 134, which are formed in isolated p-well region (C-IPW) 131. (As will become apparent in the subsequent disclosure (e.g., FIG. 1C), p-type region 134 does not actually extend under floating gate 105). Counter-electrode regions 133-134 provide contact to the active area and act as a source of electrons for an inversion layer (to avoid deep depletion). Isolated p-well region (C-IPW) 131 is located in a corresponding deep n-well region (DNW) 132, which in turn, is located in p-type substrate 110. Counter-electrode regions 133-134 are coupled to the control gate terminal CG(C-IPW) of memory cell 100. Deep n-well region 132 is coupled to a bias control terminal C-NW (which is not illustrated in FIG. 1A). Again, a dielectric region separates the floating gate electrode 105 from the underlying isolated p-well region 131.

The counter-electrode of tunnel capacitor $C_T$ is formed by active area that includes n-type region 143 and p-type region 144, which are formed in isolated p-well region (T-IPW) 141. (As will become apparent in the subsequent disclosure (e.g., FIG. 1C), p-type region 144 does not actually extend under floating gate 105.) Counter-electrode regions 143-144 serve similar purposes as counter electrode regions 133-134. Isolated p-well region (T-IPW) 141 is located in a corresponding deep n-well region (DNW) 142, which in turn, is located in p-type substrate 110. Counter-electrode regions 143-144 are coupled to the tunnel gate terminal TG(T-IPW) of memory cell 100. Deep n-well region 142 is coupled to a bias control terminal T-NW (which is not illustrated in FIG. 1A). Again, a dielectric layer separates the floating gate electrode 105 from the underlying isolated p-well region 141.

In the described embodiments, transistors $P_I$, $P_{SEL}$, $N_I$ and $N_{SEL}$ and capacitors $C_T$ and $C_C$ share a common dielectric layer, which separates floating gate 105 from the underlying regions in substrate 110. In the described examples, this dielectric layer is thermally grown silicon oxide having an effective oxide thickness (EOT) of about 70 Angstroms.

Figure 1C:
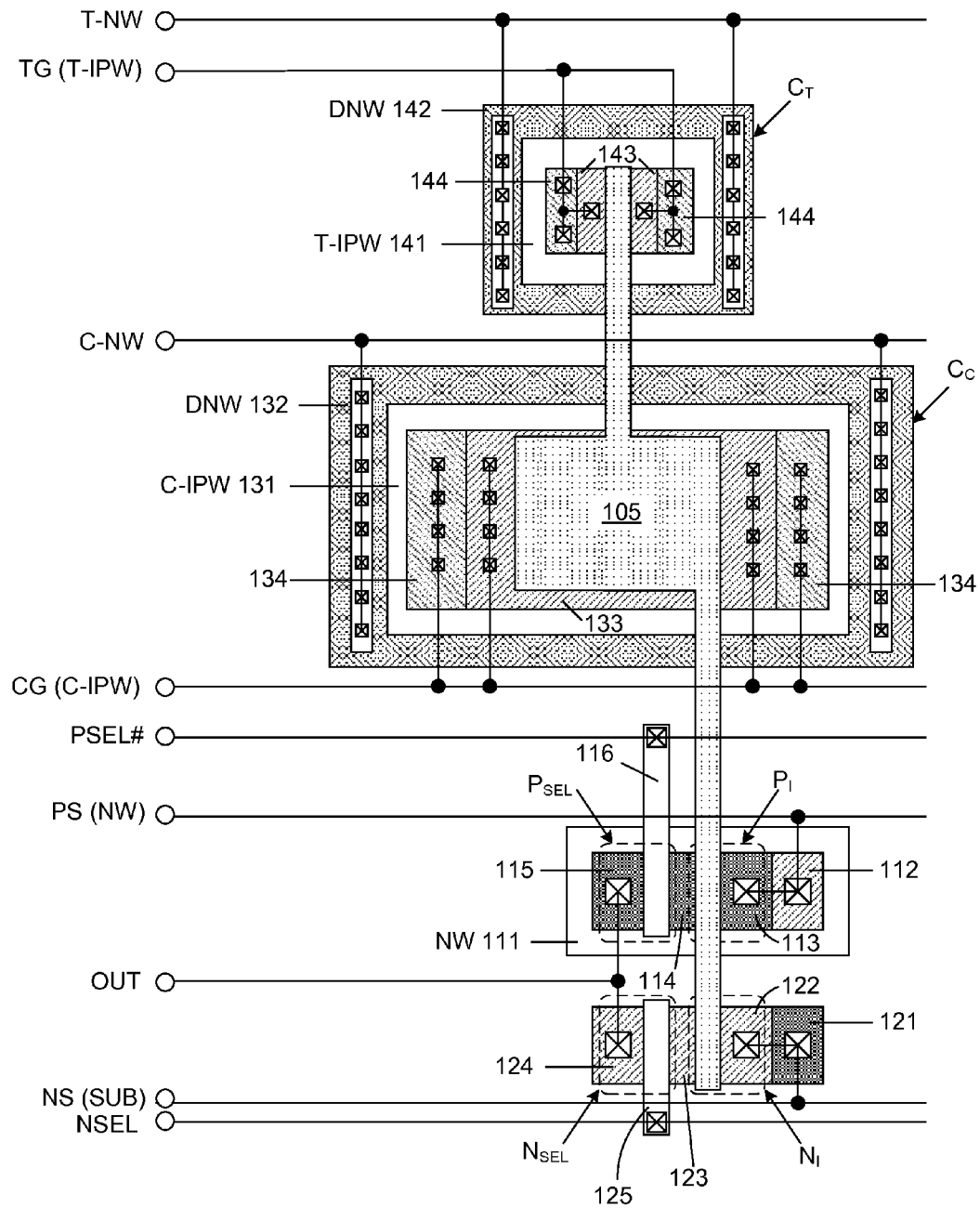
FIG. 1C is a top layout view of the memory cell of FIGS. 1A and 1B in accordance with one embodiment of the present invention.

FIG. 1C is a top layout view of memory cell 100 in accordance with one embodiment of the present invention. Similar elements are labeled with similar reference numbers in FIGS. 1A-1C. Contact elements, which connect different layers, are illustrated as boxes containing X's in FIG. 1C.

Figure 1D:
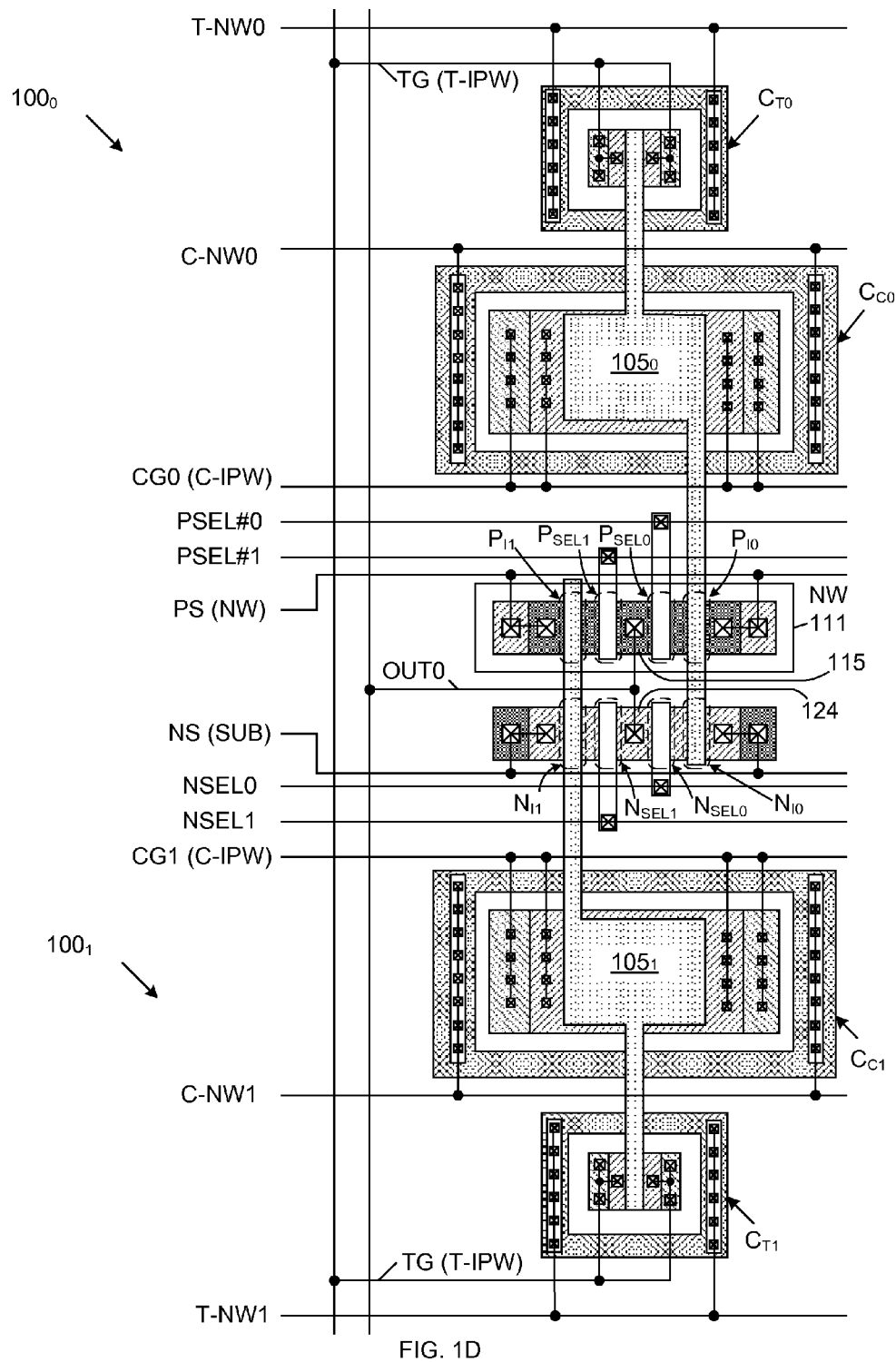
FIG. 1D is a top layout view of two adjacent memory cells, which are substantially identical to the memory cells of FIGS. 1A-1C, in accordance with one embodiment of the present invention.

FIG. 1D is a top layout view of two adjacent memory cells $100_0$ and $100_1$ in accordance with one embodiment of the present invention. Each of memory cells $100_0$ and $100_1$ is substantially identical to memory cell 100 (FIGS. 1A-1C), with differences noted below. Memory cell $100_0$ is laid out in the manner illustrated in FIG. 1C, and the layout of memory cell $100_1$ is rotated 180 degrees with respect to memory cell $100_0$. The various elements of memory cell $100_0$ are labeled with the suffix '0', and the various elements of memory cell $100_1$ are labeled with the suffix '1'. Thus, memory cell $100_0$ includes floating gate $105_0$, tunnel capacitor $C_{T0}$, control capacitor $C_{C0}$, PMOS pull-up transistor $P_{I0}$, NMOS pull-down transistor $N_{I0}$, PMOS select transistor $P_{SEL0}$ and NMOS select transistor $N_{SEL0}$. Similarly, memory cell $100_1$ includes floating gate $105_1$, tunnel capacitor $C_{T1}$, control capacitor $C_{C1}$, PMOS pull-up transistor $P_{I1}$, NMOS pull-down transistor $N_{I1}$, PMOS select transistor $P_{SEL1}$ and NMOS select transistor $N_{SEL1}$.

Memory cell $100_0$ is coupled to corresponding terminals T-NW0, C-NW0, CG0(C-IPW), PSEL#0 and NSEL0. Similarly, memory cell $100_1$ is coupled to corresponding terminals T-NW1, C-NW1, CG1(C-IPW), PSEL#1 and NSEL1. Memory cells $100_0$ and $100_1$ share terminals PS(NW), NS(SUB), OUT0 and TG0(T-IPW).

PMOS transistors $P_{I1}$, $P_{SEL1}$/$P_{SEL0}$ and $P_{I0}$ share a common n-well region (e.g., n-well 111). PMOS select transistors $P_{SEL0}$ and $P_{SEL1}$ share a common drain region (e.g., p-type region 115), which is coupled to a shared data output terminal OUT0. Similarly, NMOS select transistors $N_{SEL0}$ and $N_{SEL1}$ share a common drain region (e.g., n-type region 124), which is coupled to a shared data output terminal OUT0.

As illustrated in FIG. 1D, PMOS transistors $P_{I1}$, $P_{SEL1}$, $P_{SEL0}$ and $P_{I0}$ are linearly adjacent to one another, and NMOS transistors $N_{I1}$, $N_{SEL1}$, $N_{SEL0}$ and $N_{I0}$ are linearly adjacent to one another, such that memory cells $100_0$ and $100_1$ share a common layout area between the control capacitors $C_{C0}$ and $C_{C1}$. Because the total width of the PMOS transistors $P_{I1}$, $P_{SEL1}$, $P_{SEL0}$ and $P_{I0}$, and the total width of the NMOS transistors $N_{I1}$, $N_{SEL1}$, $N_{SEL0}$ and $N_{I0}$ are less than the width of the control capacitors $C_{C0}$ and $C_{C1}$, the layout of memory cells $100_0$ and $100_1$ is advantageously very compact, and substantially rectangular. Stated another way, memory cells $100_0$ and $100_1$ have 'L' shaped layout areas, which are joined to form a rectangular layout area. Note that eliminating the contacts between the inverter transistors and the select transistors allows this area-efficient layout. In one embodiment, adjacent memory cells $100_0$ and $100_1$ can be fabricated on a layout area of 4 um by 25 um using a conventional 0.18 micron CMOS logic process, thus resulting in a layout area of 4*25/2=50 um$^2$ per cell.

Figure 1E:
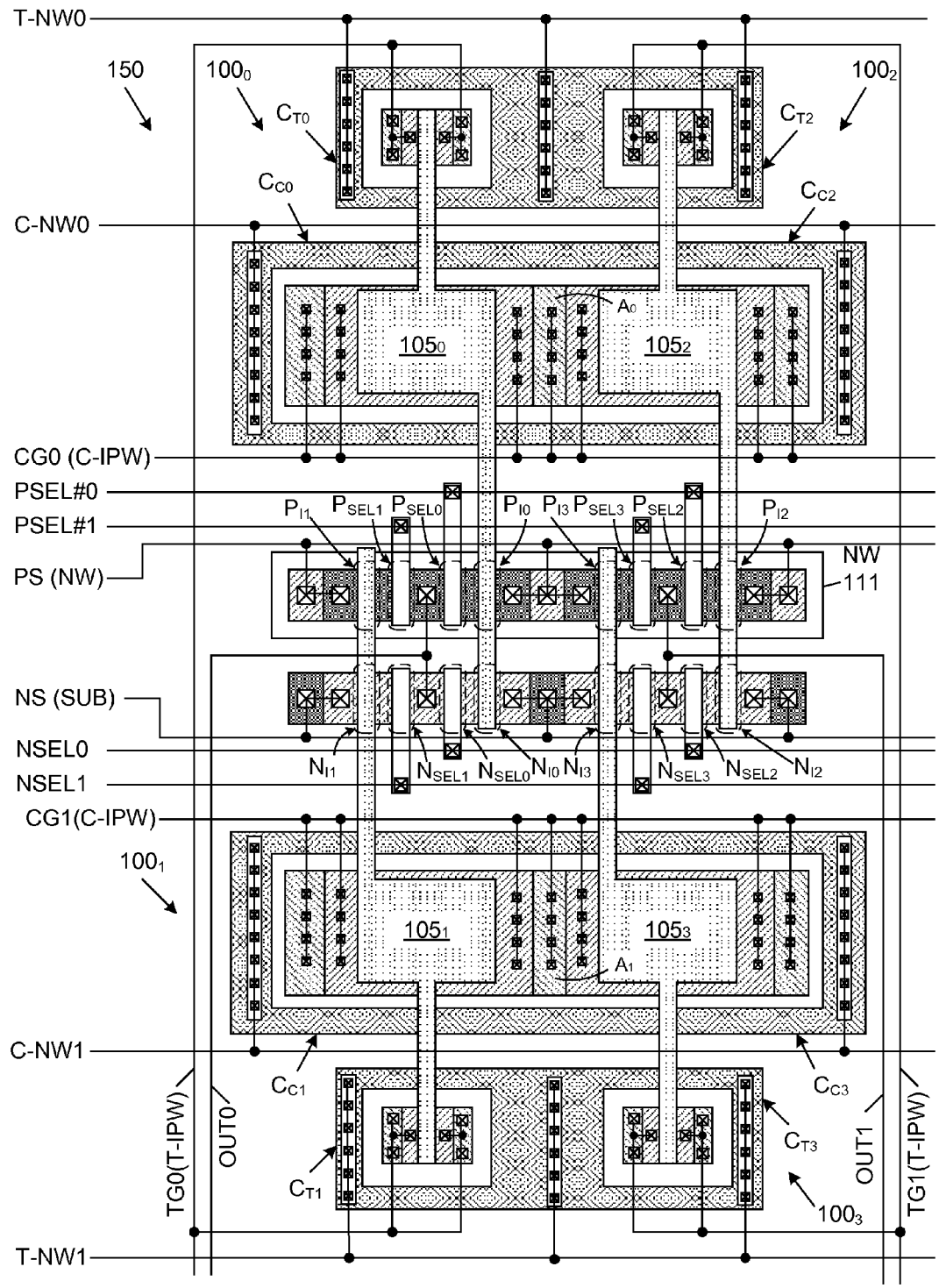
FIG. 1E is a top layout view of a 2×2 array of memory cells, which are substantially identical to the memory cells of FIGS. 1A-1C, in accordance with one embodiment of the present invention.

FIG. 1E is a block diagram illustrating a 2×2 array 150 of memory cells $100_0$, $100_1$, $100_2$ and $100_3$ in accordance with one embodiment of the present invention. Memory cells $100_2$ and $100_3$ are laid out in a manner substantially identical to memory cells $100_0$ and $100_1$, respectively, with differences noted below.

The various elements of memory cells $100_2$ and $100_3$ are labeled with the suffixes '2' and '3', respectively. Thus, memory cell $100_2$ includes floating gate $105_2$ tunnel capacitor $C_{T2}$, control capacitor $C_{C2}$, PMOS pull-up transistor $P_{I2}$, NMOS pull-down transistor $N_{I2}$, PMOS select transistor $P_{SEL2}$ and NMOS select transistor $N_{SEL2}$. Similarly, memory cell $100_3$ includes floating gate $105_3$, tunnel capacitor $C_{T3}$, control capacitor $C_{C3}$, PMOS pull-up transistor $P_{I3}$, NMOS pull-down transistor $N_{I3}$, PMOS select transistor $P_{SEL3}$ and NMOS select transistor $N_{SEL3}$.

Memory cells $100_0$ and $100_2$ are coupled to corresponding terminals T-NW0, C-NW0, CG0(C-IPW), PSEL#0 and NSEL0. Similarly, memory cells $100_1$ and $100_3$ are coupled to corresponding terminals T-NW1, C-NW1, CG1(C-IPW), PSEL#1 and NSEL1. Memory cells $100_0$-$100_3$ are commonly coupled to terminals PS(NW) and NS(SUB). Memory cells $100_0$ and $100_1$ are coupled to terminals OUT0 and TG0(T-IPW). Memory cells $100_2$ and $100_3$ are coupled to terminals OUT1 and TG1(T-IPW).

As illustrated in FIG. 1E, PMOS transistors $P_{I1}$, $P_{SEL1}$, $P_{SEL0}$, $P_{I0}$, $P_{I2}$, $P_{SEL2}$, $P_{SEL3}$, $P_{I3}$ are linearly adjacent to one another, and share a common n-well region (e.g., n-well 111), thereby minimizing the required layout area of array 150. A single n-type contact region is located between (and shared by) adjacent PMOS transistors $P_{I0}$ and $P_{I3}$, further reducing the required layout area.

Similarly, NMOS transistors $N_{I1}$, $N_{SEL1}$, $N_{SEL0}$, $N_{I0}$, $N_{I2}$, $N_{SEL2}$, $N_{SEL3}$, $N_{I3}$ are linearly adjacent to one another, thereby minimizing the required layout area of array 150. A single P-type contact region is located between (and shared by) adjacent NMOS transistors $N_{I0}$ and $N_{I3}$, further reducing the required layout area. The checkerboard-like orientation of the memory cells $100_0$-$100_3$ in array 150 allows compact positioning of the output circuits and CMOS inverters in the manner illustrated.

Within each row of the array 150, the isolated p-well regions (C-IPW) of the control capacitors $C_C$ are merged to provide effective area utilization. For example, the isolated p-well regions (C-IPW) of the control capacitors $C_{C0}$ and $C_{C2}$ of memory cells $100_0$ and $100_2$ are merged to form a single isolated p-well region (C-IPW), which is located in a single corresponding deep n-well. Similarly, the isolated p-well regions (C-IPW) of the control capacitors $C_{C1}$ and $C_{C3}$ of memory cells $100_1$ and $100_3$ are merged to form a single isolated p-well region (C-IPW), which is located in a single corresponding deep n-well.

The p-type active areas of adjacent control capacitors $C_C$ are also merged to save layout area. For example, a single p-type active area $A_0$ is located between adjacent floating gate electrodes $105_0$ and $105_2$ in the first row, and a single p-type active area $A_1$ is located between adjacent floating gate electrodes $105_1$ and $105_3$ in the second row.

The above-described arrangements of the control capacitors $C_C$ further improve the layout density of array 150.

Although a 2×2 array of memory cells is illustrated in FIG. 1E, it is understood that arrays of other sizes could be implemented by extending the structure of FIG. 1E. For arrays having more than two rows, the structure of array 150 is tiled in a vertical direction. In such arrays, the isolated p-well regions (but not the active areas) of vertically adjacent tunneling capacitors can be merged within a common deep n-well to further minimize layout area. As described in more detail below, the array organization of FIG. 1E allows separate reading, programming and erase operations to be performed to each memory cell of the array.

Figure 1F:
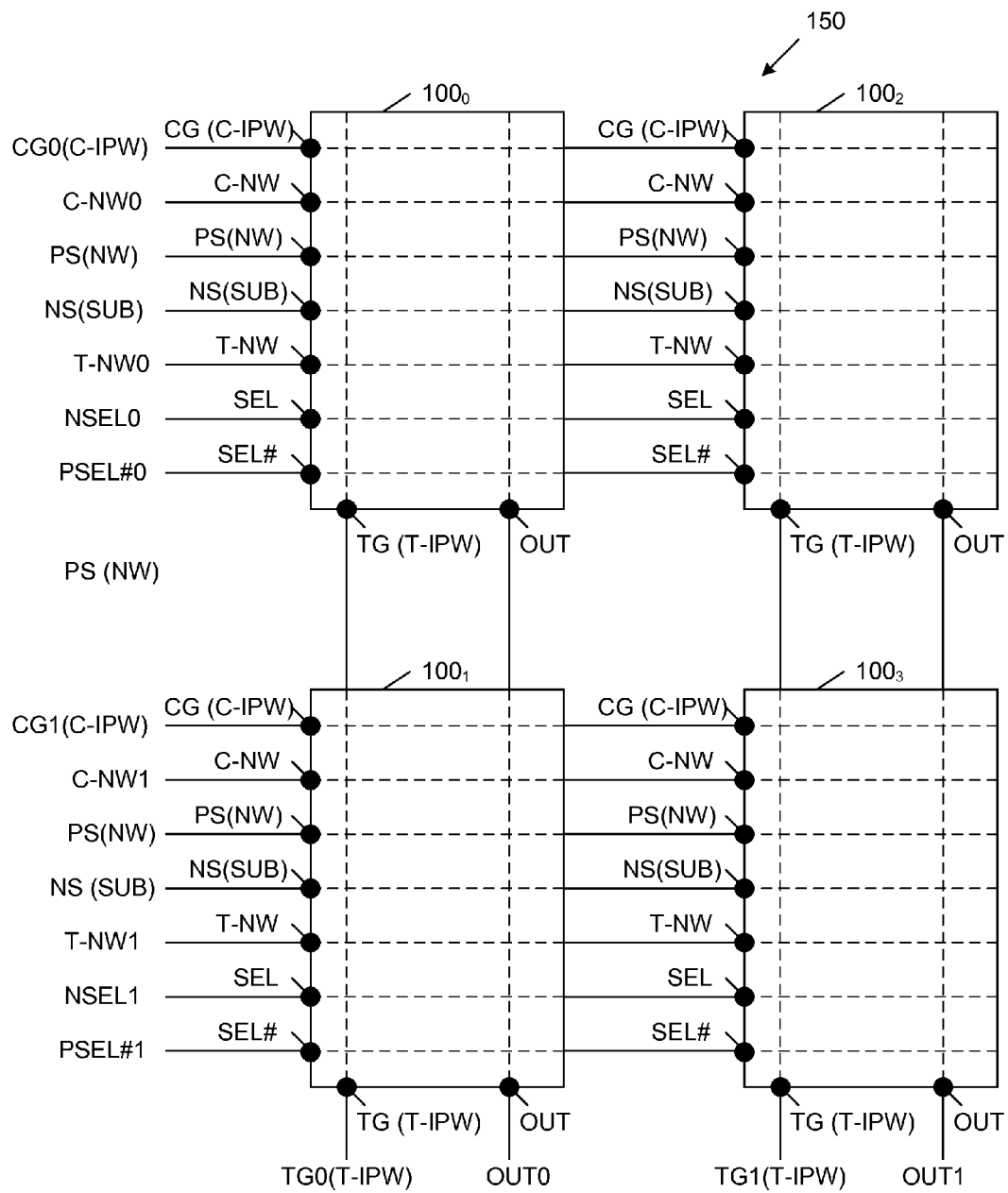
FIG. 1F is a block diagram that illustrates the 2×2 array of memory cells of FIG. 1E.

FIG. 1F is a simplified block diagram that illustrates the 2×2 array 150 of FIG. 1E. The array 150 operates as follows in accordance with one embodiment of the present invention. In the described examples, memory cell $100_0$ is selected for access, and memory cells $100_1$-$100_3$ are unselected.

Figure 1G:
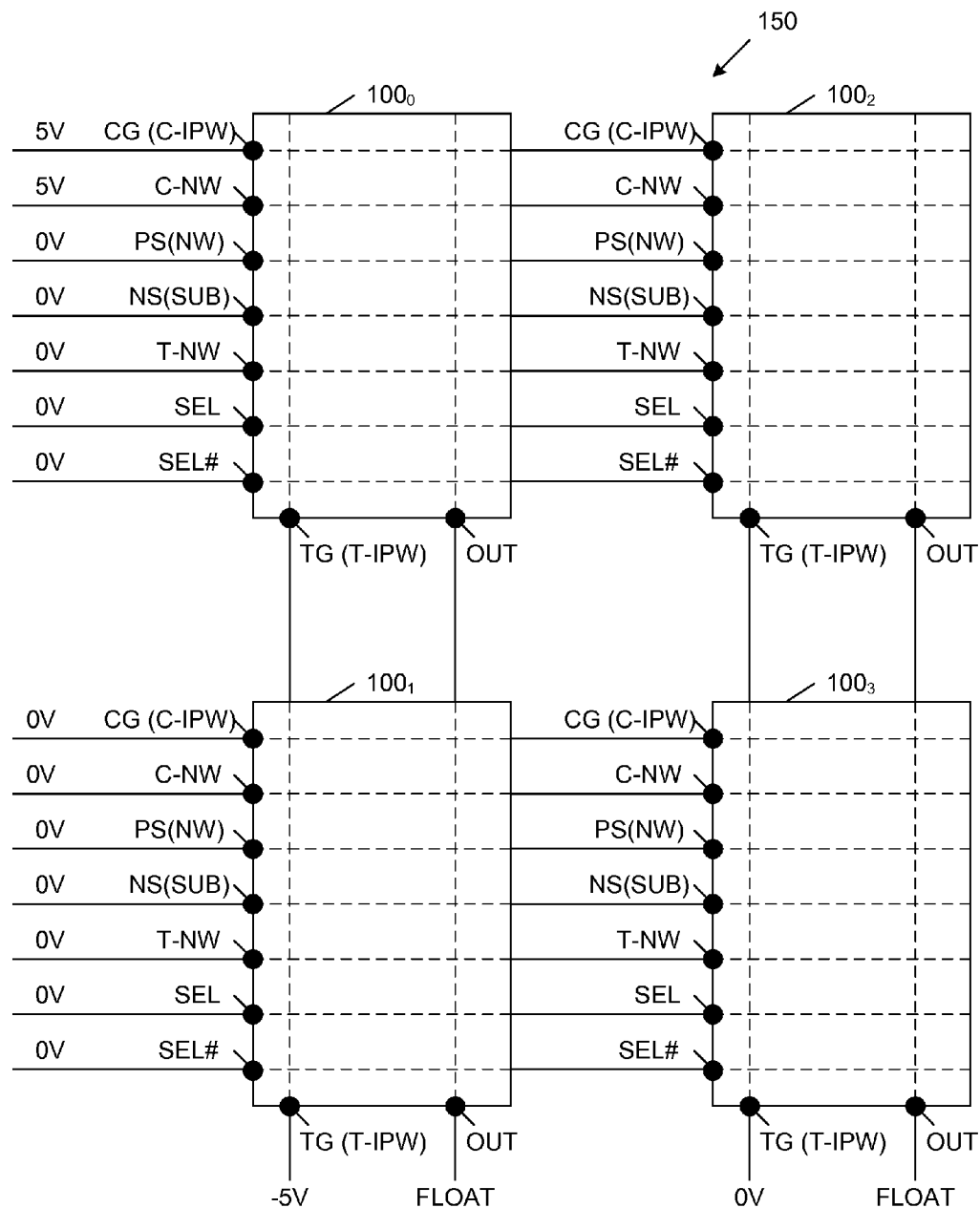
FIG. 1G is a block diagram that illustrates the programming of a selected memory cell within the array of FIG. 1E in accordance with one embodiment of the present invention.

FIG. 1G is a block diagram of array 150 that illustrates the voltages applied to the various terminals of array 150 in order to program memory cell $100_0$. A programming voltage of 5 Volts is applied to the control gates CG0(C-IPW) and the associated deep n-wells C-NW0 of memory cells $100_0$ and $100_2$. A programming voltage of −5 Volts is applied to the tunnel gates TG0(T-IPW) of memory cells $100_0$ and $100_1$. The output terminals OUT0, OUT1 of memory cells $100_0$-$100_3$ are maintained in a floating state. The remaining terminals of memory cells $100_0$-$100_3$ are coupled to ground (0 Volts).

Under these conditions, Fowler-Nordheim (F-N) tunneling occurs within memory cell $100_0$ in response to the 10 Volt difference between the control gate CG and the tunnel gate TG within this cell. More specifically, the F-N injection of electrons is induced from tunnel gate TG into floating gate $105_0$ during the programming operation. The voltages applied to memory cells $100_1$-$100_3$ are insufficient to induce F-N tunneling within these cells.

Figure 1H:
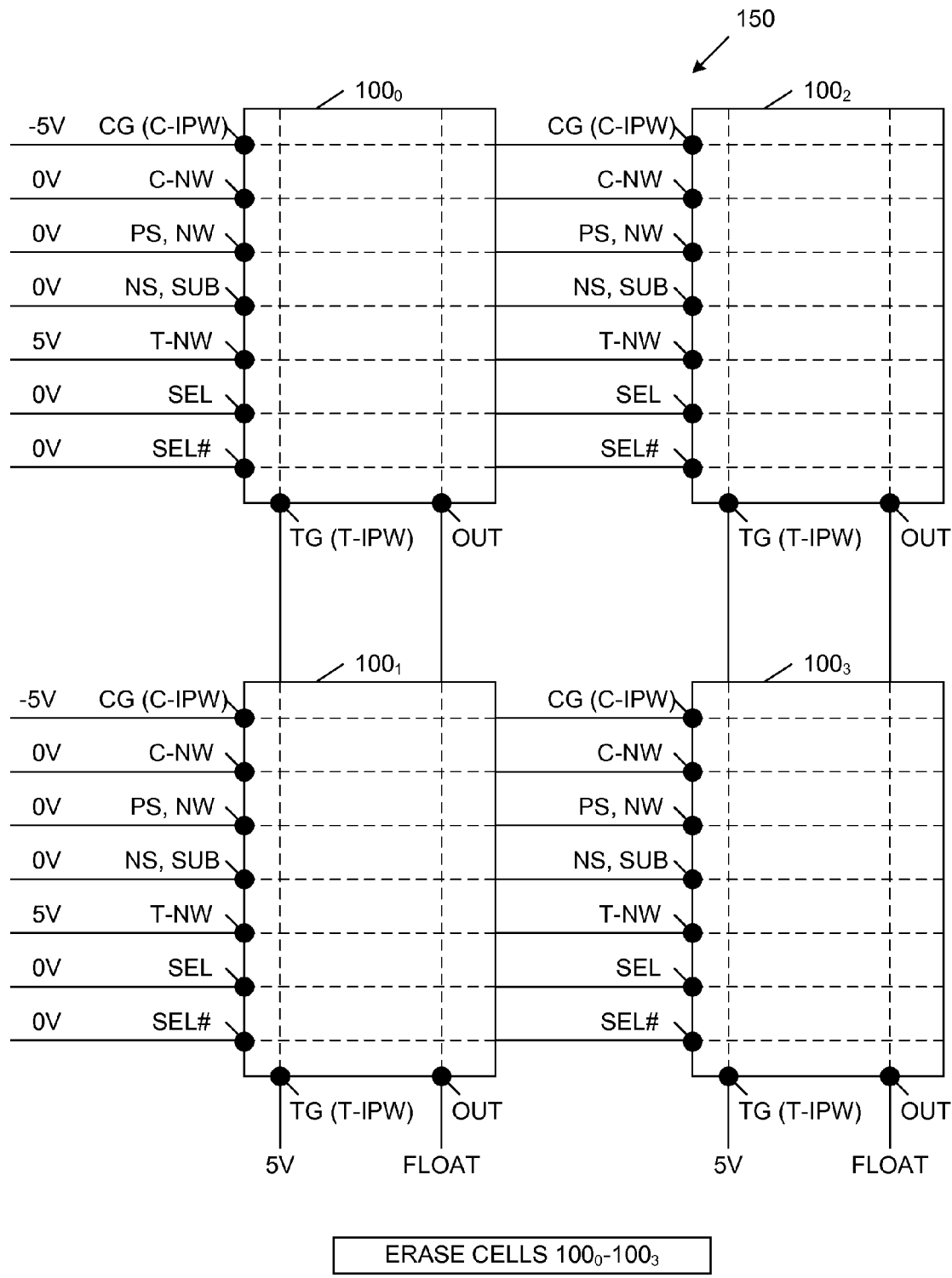
FIG. 1H is a block diagram that illustrates the simultaneous erasing of all the cells in the array of FIG. 1E in accordance with one embodiment of the present invention.

FIG. 1H is a block diagram of array 150 that illustrates the voltages applied to the various terminals of array 150 in order to erase memory cells $100_0$-$100_3$. An erase voltage of −5 Volts is applied to the control gates CG0(C-IPW) and CG1(C-IPW) of memory cells $100_0$-$100_3$. An erase voltage of 5 Volts is applied to the tunnel gates TG0(T-IPW) and TG1(T-IPW) of memory cells $100_0$-$100_3$, and to the deep n-well regions T-NW0 and T-NW1 of memory cells $100_0$-$100_3$. The output terminals OUT0, OUT1 of memory cells $100_0$-$100_3$ are maintained in a floating state. The remaining terminals of memory cells $100_0$-$100_3$ are coupled to ground (0 Volts).

Under these conditions, Fowler-Nordheim (F-N) tunneling occurs within memory cells $100_0$-$100_3$ in response to the 10 Volt difference between the control gate CG and the tunnel gate TG within these cells. More specifically, electrons are removed from floating gates $105_{0-3}$ by F-N injection to tunnel gates TG0(T-IPW) and TG1(T-IPW) during the erase operation.

Although the program and erase operations have been described in connection with voltages of 5V and −5V, which create a 10V difference between the control gate CG(C-IPW) and the tunnel gate TG(T-IPW) of the memory cell being programmed/erased, it is understood that this 10V difference could be introduced in other manners in other embodiments. For example, a 10 Volt signal could be applied to the control gate CG(C-IPW) and a 0 Volt signal could be applied to the tunnel gate TG(T-IPW) to perform a program operation. Conversely, a 10 Volt signal could be applied to the tunnel gate TG(T-IPW) and a 10 Volt signal could be applied to the control gate CG(C-IPW) to perform an erase operation. Alternately, a −10 Volt signal could be applied to the control gate CG(C-IPW) and a 0 Volt signal could be applied to the tunnel gate TG(T-IPW) to perform an erase operation.

The structure of memory cell 100 allows the sensing of the state of the memory cell to be performed in several ways. First, a CMOS inverter logic readout can be performed by turning on both the PMOS select transistor PSEL and the NMOS select transistor NSEL, and sensing the voltage on the output terminal OUT. Second, the PMOS select transistor PSEL can be turned off, and the NMOS select transistor NSEL can be turned on, and the current flowing through the NMOS select transistor NSEL and the NMOS pull-down transistor N1 can be sensed at the output terminal OUT. Alternately, the NMOS select transistor $N_{SEL}$ can be turned off, and the PMOS select transistor $P_{SEL}$ can be turned on, and the current flowing through the PMOS select transistor $P_{SEL}$ and the PMOS pull-down transistor $P_1$ can be sensed at the output terminal OUT. This allows flexibility in the design of memory arrays that utilize the proposed memory cell 100, so that either logic or analog read-out can be implemented. Table 1 below illustrates the voltages applied to the various terminals of memory cell 100 in order to perform an inverter logic readout, an analog readout through NMOS select transistor $N_{SEL}$, and an analog readout through PMOS select transistor $P_{SEL}$. In the described embodiment, the positive supply voltage $V_{DD}$ can be, for example, 3.3 Volts.

Figure 1I:
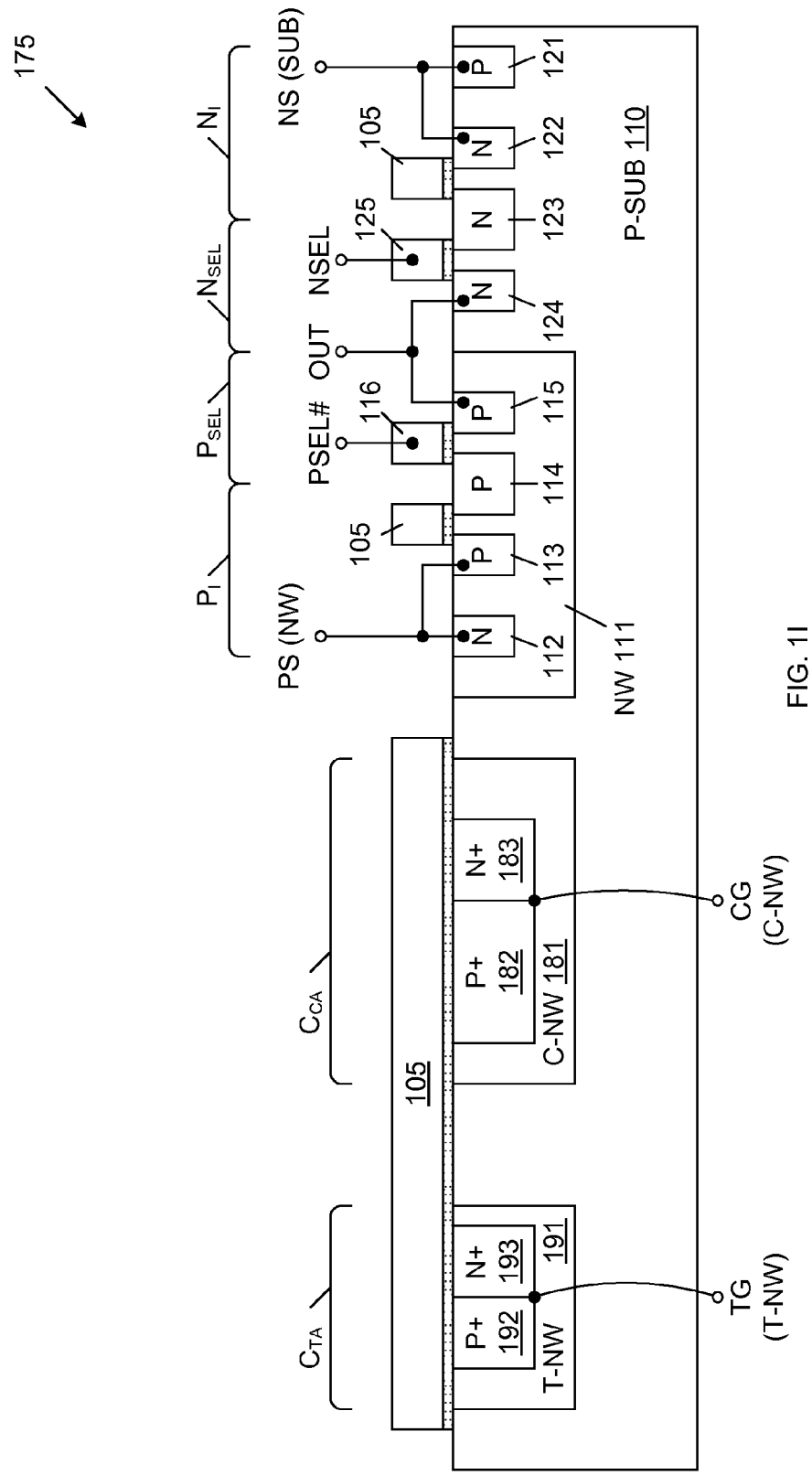
FIG. 1I is a conceptual cross sectional view of a single-poly non-volatile memory cell, that does not require deep well regions, in accordance with a one variation of the first embodiment of the present invention.

FIG. 1I is a conceptual cross sectional view of a non-volatile memory cell 175 in accordance with a one variation of the first embodiment of the present invention. Because non-volatile memory cell 175 is similar to non-volatile memory cell 100, similar elements are labeled with similar reference numbers in FIG. 1B and FIG. 1H. Memory cell 175 replaces the tunnel capacitor $C_T$ and the control capacitor $C_C$ of memory cell 100 with tunnel capacitor $C_{TA}$ and control capacitor $C_{CA}$.

The counter-electrode of control capacitor $C_{CA}$ is formed by an active area that includes p-type region 182 and n-type region 183, which are formed in n-well region (C-NW) 181. (Note that n-type region 183 does not actually extend under floating gate 105). Counter-electrode regions 182-183 are coupled to the control gate terminal CG(C-NW) of memory cell 175.

Similarly, the counter-electrode of tunnel capacitor $C_{TA}$ is formed by active area that includes p-type region 192 and n-type region 193, which are formed in n-well region (T-NW) 191. (Note that n-type region 193 does not actually extend under floating gate 105.) Counter-electrode regions 192-193 are coupled to the tunnel gate terminal TG(T-NW) of memory cell 175.

N-well regions 181 and 191 are formed in p-type substrate 110, thereby eliminating the requirement for the deep n-well regions 132 and 142 found in memory cell 100. Because no deep n-well mask is required to fabricate memory cell 175, the cell layout area of memory cell 175 can be reduced (with respect to the layout area of memory cell 100), because the n-well design rules are more loose than the deep n-well design rules, despite the penalty connected with use of big DMOS devices. Memory cell 175 is programmed and erased by a Fowler-Nordheim mechanism similar to memory cell 100. More specifically, memory cell 175 is programmed and erased by applying a high positive voltage (~10V for a 70 Angstrom gate oxide thickness) to the control capacitor $C_{CA}$ and the tunnel capacitor $C_{TA}$ correspondingly, while the CMOS inverter (formed by PMOS pull-up transistor $P_I$ and NMOS pull-down transistor $N_I$) is shut down. Tables 2 and 3 below list the voltages applied to the various terminals of memory cell 175 to perform program and erase operations, respectively, in accordance with one embodiment.

TABLE 1

READING SCHEMES FOR MEMORY CELL 100

| | CG | C-NW | PS | NS | T-NW | NSEL | PSEL# | TG | OUT |
|---|---|---|---|---|---|---|---|---|---|
| Logic Read | $V_{DD}$ | $V_{DD}$ | $V_{DD}$ | 0 | 0 | $V_{DD}$ | 0 | 0 | To input of logic circuit |
| Analog Read through $N_{SEL}$ | $V_{DD}$ | $V_{DD}$ | $V_{DD}$ | 0 | 0 | $V_{DD}$ | $V_{DD}$ | 0 | To input of sense amplifier for current sensing |
| Analog Read through $P_{SEL}$ | $V_{DD}$ | $V_{DD}$ | $V_{DD}$ | 0 | 0 | 0 | 0 | 0 | To input of sense amplifier for current sensing |

TABLE 2

Program Voltages for Memory Cell 175

| Terminal | Voltage |
|---|---|
| TG(T-NW) | 0 |
| CG(C-NW) | 10 V |
| PS(NW) | 0 |
| NS(SUB) | 0 |
| PSEL# | 0 |
| NSEL | 0 |
| OUT | Floating |

TABLE 3

Erase Voltages for Memory Cell 175

| Terminal | Voltage |
|---|---|
| TG(T-NW) | 10 V |
| CG(C-NW) | 0 |
| PS(NW) | 0 |
| NS(SUB) | 0 |
| PSEL# | 0 |
| NSEL | 0 |
| OUT | Floating |

In a particular embodiment, tunnel capacitor $C_{TA}$ and control capacitor $C_{CA}$ include LDMOS transistors connected to n-wells 191 and 181, respectively. Alternately, tunnel capacitor $C_{TA}$ and control capacitor $C_{CA}$ may include pairs of cascode-connected transistors connected to n-wells 191 and 181, respectively.

Second Embodiment

In accordance with an alternate embodiment of the present invention, the tunnel capacitor $C_T$ is eliminated from memory cell 100, and the NMOS transistors $N_I$ and $N_{SET}$ are located in an isolated p-well region (IPW). Also in this embodiment, the NMOS pull-down transistor $N_I$ of the CMOS inverter 101 (i.e., the NMOS pull-down transistor $N_{II}$ of the CMOS inverter circuit 201, below) serves as an injection capacitor in the program and erase modes. Also in this embodiment, the PMOS pull-up transistor $P_I$ of the CMOS inverter 101 (i.e., the PMOS pull-up transistor $P_{II}$ of the CMOS inverter circuit 201, below) serves as an injection capacitor in the erase mode. A significant reduction in the required memory cell layout area is achieved due to the elimination of the tunnel capacitor $C_T$. In a particular embodiment, the required layout area of the memory cell can be reduced from about 55 um² to about 33 um². This alternate embodiment is described in more detail below in connection with FIGS. 2A-2G.

Figure 2A:
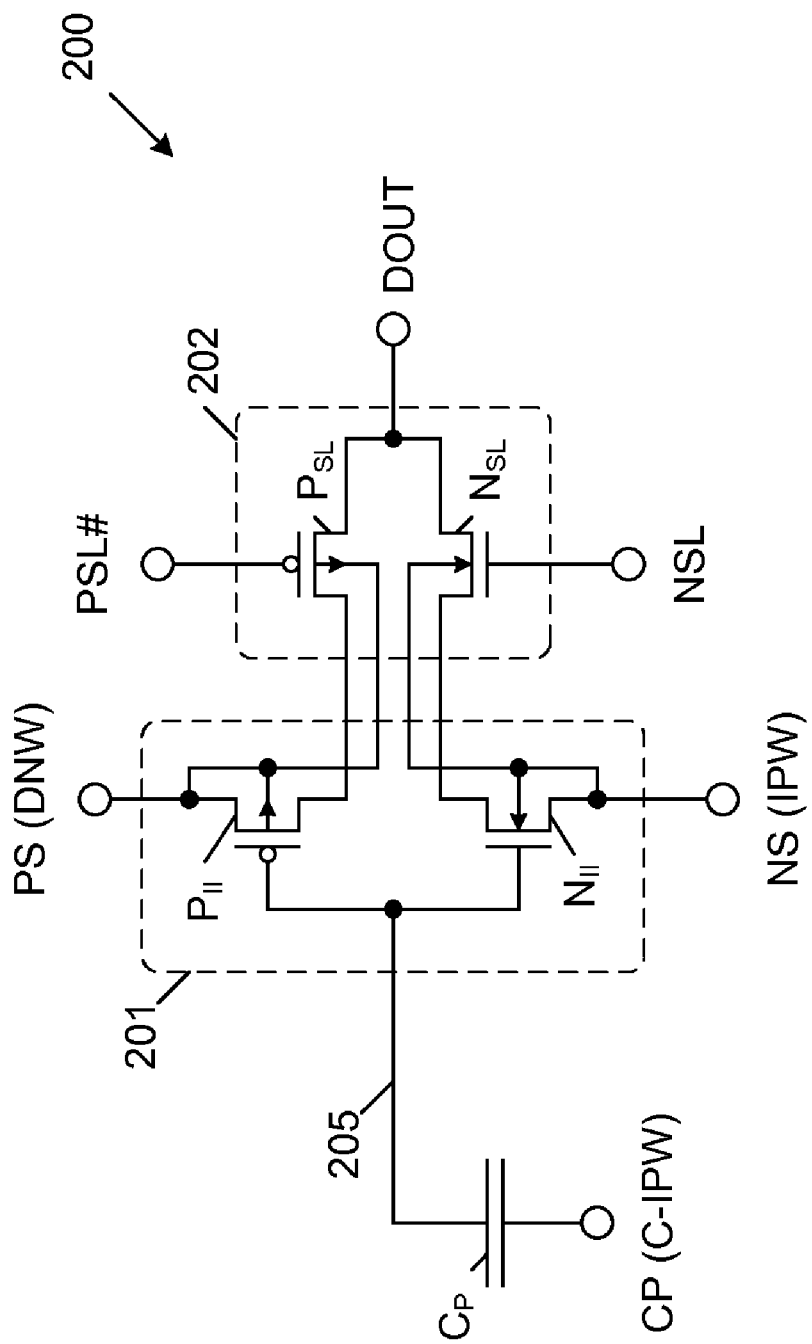
FIG. 2A is a circuit diagram of a single-poly non-volatile memory cell in accordance with the second embodiment of the present invention.

FIG. 2A is a circuit diagram of a single-poly non-volatile memory cell 200 in accordance with the second embodiment of the present invention. Memory cell 200 includes control capacitor $C_P$, CMOS inverter circuit 201, and read output circuit 202. CMOS inverter circuit 201 includes PMOS pull-up transistor $P_{II}$ and NMOS pull-down transistor $N_{II}$. Read output circuit 202 includes PMOS select transistor $P_{SL}$ and NMOS select transistor $N_{SL}$. Control capacitor $C_P$, PMOS pull-up transistor $P_{II}$ and NMOS pull-down transistor $N_{II}$ share a common floating gate electrode 205. That is, floating gate electrode 205 forms the gates of PMOS pull-up transistor $P_{II}$ and NMOS pull-down transistor $N_{II}$, and also forms the electrode of control capacitor $C_p$. In the described embodiments, floating gate electrode 205 is conductively doped polysilicon, which is fabricated in accordance with a single-poly CMOS logic process. The counter-electrode of control capacitor $C_P$ is coupled to control gate terminal CP(C-IPW).

PMOS pull-up transistor $P_{II}$ has a source region and a body region (e.g., an n-well/deep n-well region) commonly coupled to an inverter pull-up terminal PS(DNW). The body region of PMOS select transistor $P_{SL}$ is also coupled to the inverter pull-up terminal PS(DNW). NMOS transistor $N_{II}$ has a source region and a body region (e.g., an isolated p-well region) commonly coupled to an inverter pull-down terminal NS(IPW). The body region of NMOS select transistor $N_{SL}$ is also coupled to the inverter pull-down terminal NS(IPW).

The drain of PMOS pull-up transistor $P_{II}$ is coupled directly to the source of PMOS select transistor $P_{SL}$. In one embodiment, PMOS transistors $P_{II}$ and $P_{SL}$ share a common continuous p-type region within an associated n-well region.

Similarly, the drain of NMOS pull-down transistor $N_{II}$ is coupled directly to the source of NMOS select transistor $N_{SL}$. In one embodiment, NMOS transistors $N_{II}$ and $N_{SL}$, share a common continuous n-type region within an isolated p-well region.

The drains of select transistors $P_{SL}$, and $N_{SL}$, are commonly connected to a data output terminal DOUT. The gates of select transistors $P_{SL}$, and $N_{SL}$, are coupled to select terminals PSL# and NSL, respectively.

Figure 2B:
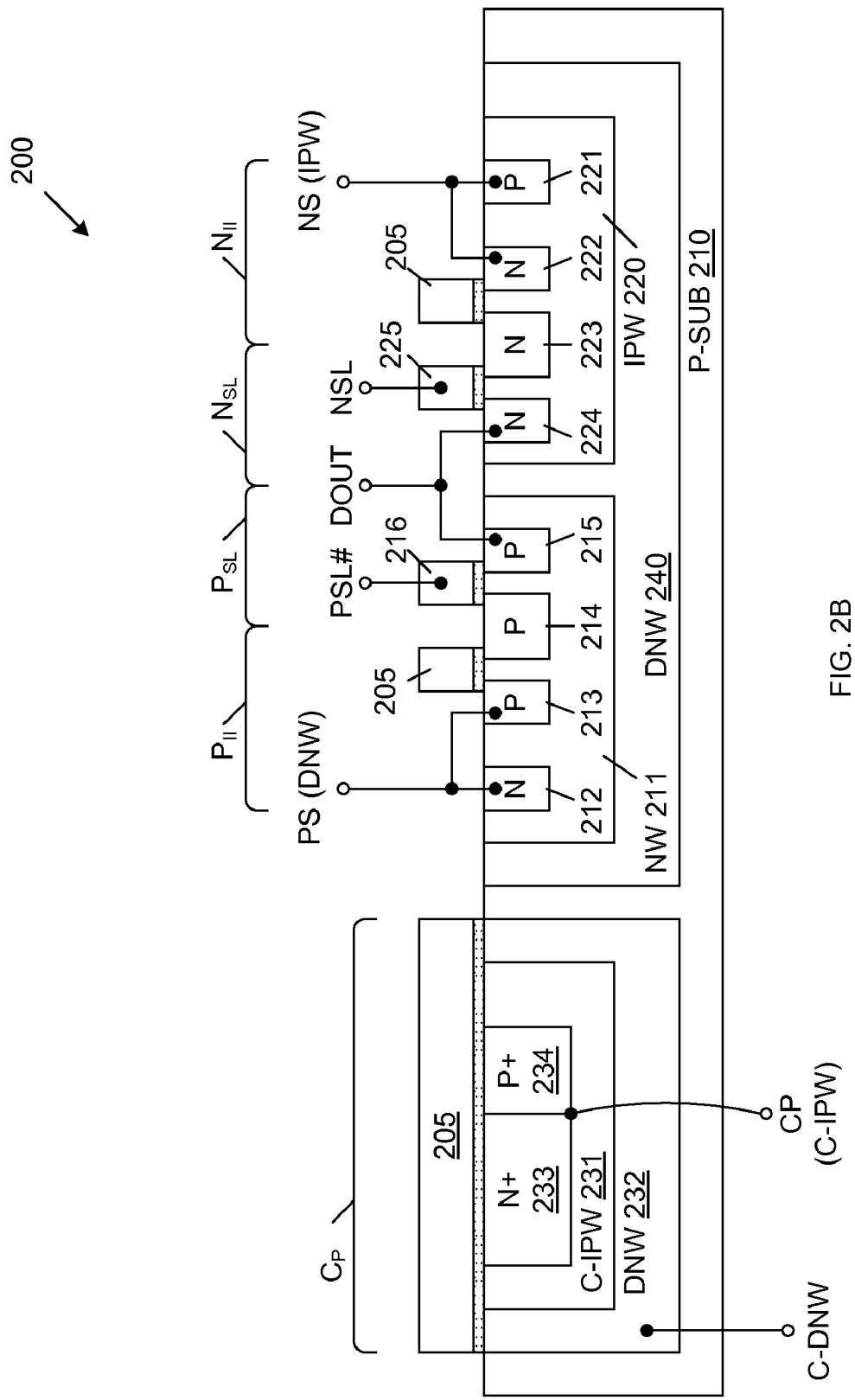
FIG. 2B is a conceptual cross-sectional view of the various elements of the memory cell of FIG. 2A in accordance with one embodiment of the present invention.

FIG. 2B is a conceptual cross-sectional view of the various elements of memory cell 200 in accordance with one embodiment of the present invention. Although floating gate 205 is illustrated in three separate pieces in the view of FIG. 2B, it is understood that floating gate 205 is a single continuous piece, which is joined at locations outside the view of FIG. 2B. Moreover, it is understood that certain convention structures typically available in conventional CMOS processes, such as dielectric sidewall spacers, lightly doped source/drain regions and silicide structures, are not illustrated in FIG. 2B, but may be included in memory cell 200 in various embodiments.

In the embodiment illustrated by FIG. 2B, memory cell 200 is fabricated in a p-type semiconductor substrate (P-SUB) 210. NMOS transistors $N_{II}$ and $N_{SL}$, are fabricated in an isolated p-well (IPW) 220, which in turn, is located in a deep n-well (DNW) 240. As illustrated in FIG. 2B, NMOS transistor $N_{II}$ includes n-type source region 222 and n-type source/drain region 223 (which forms the drain of NMOS transistor $N_{II}$). Floating gate 205 extends over the channel region that exists between n-type source/drain regions 222-223. Note that a dielectric region separates floating gate 205 from the underlying semiconductor regions.

NMOS select transistor $N_{SL}$, includes n-type source/drain region 223 (which forms the source of NMOS transistor $N_{SL}$) and n-type drain region 224. A polysilicon select gate 225 extends over the channel region that exists between n-type source/drain regions 223-224. Note that a dielectric region separates select gate 225 from the underlying semiconductor regions. Select gate 225 is coupled to the select terminal NSL of memory cell 200.

NMOS transistors $N_{II}$ and $N_{SL}$, share the continuous n-type source/drain region 223, which advantageously reduces the required layout area of these transistors $N_{II}$ and $N_{SL}$.

P-type contact region 221, which is located in isolated p-well 220, is connected to n-type source region 222 of NMOS transistor $N_{II}$, and to the inverter pull-down terminal NS(IPW) of memory cell 200.

PMOS transistors $P_{II}$ and $P_{SL}$, are fabricated in an n-well 211, which in turn, is merged with deep n-well (DNW) 240. PMOS transistor $P_{II}$ includes p-type source region 213 and p-type source/drain region 214 (which forms the drain of PMOS transistor $P_{II}$). Floating gate 205 extends over the channel region that exists between p-type source/drain regions 213-214. Note that a dielectric region separates floating gate 205 from the underlying semiconductor regions.

PMOS select transistor $P_{SL}$, includes p-type source/drain region 214 (which forms the source of PMOS transistor $P_{SL}$) and p-type drain region 215. A polysilicon select gate 216 extends over the channel region that exists between p-type source/drain regions 214-215. Note that a dielectric region separates select gate 205 from the underlying semiconductor regions. Select gate 205 is coupled to the select terminal PSL# of memory cell 200.

PMOS transistors $P_{II}$ and $P_{SL}$, share the continuous p-type source/drain region 214, which advantageously reduces the required layout area of these transistors $P_{II}$ and $P_{SL}$.

N-type contact region 212, which is located in n-well region 211, is connected to p-type source region 213 of PMOS transistor $P_{II}$, and to the inverter pull-up terminal PS(DNW) of memory cell 200.

As described above in connection with FIG. 2A, floating gate 205 forms the electrode of control capacitor $C_P$. The counter-electrode of control capacitor $C_P$ is formed by an active area that includes n-type region 233 and p-type region 234, which are formed in isolated p-well region (C-IPW) 231. Counter-electrode regions 233-234 provide contact to the active area and act as a source of electrons for an inversion layer (to avoid deep depletion). Isolated p-well region (C-IPW) 231 is located in a corresponding deep n-well region (DNW) 232, which in turn, is located in p-type substrate 210. Counter-electrode regions 233-234 are coupled to the control gate terminal CP(C-IPW) of memory cell 200. Deep n-well region 232 is coupled to a bias control terminal C-DNW (which is not illustrated in FIG. 2A). Again, a dielectric region separates the floating gate electrode 205 from the underlying semiconductor regions.

Although FIG. 2B illustrates deep n-well regions 232 and 340 as separate regions, it is understood that these deep n-well regions 232 and 240 may be merged into a single deep n-well region in an alternate embodiment, thereby further reducing the required layout area of memory cell 200.

In the described embodiments, transistors $P_{II}$, $P_{SL}$, $N_{II}$ and $N_{SL}$, and capacitor $C_P$ share a common dielectric region, which separates floating gate 205 from the underlying regions in substrate 210. In the described examples, this dielectric layer is thermally grown silicon oxide having an effective oxide thickness (EOT) of about 70 Angstroms.

Figure 2C:
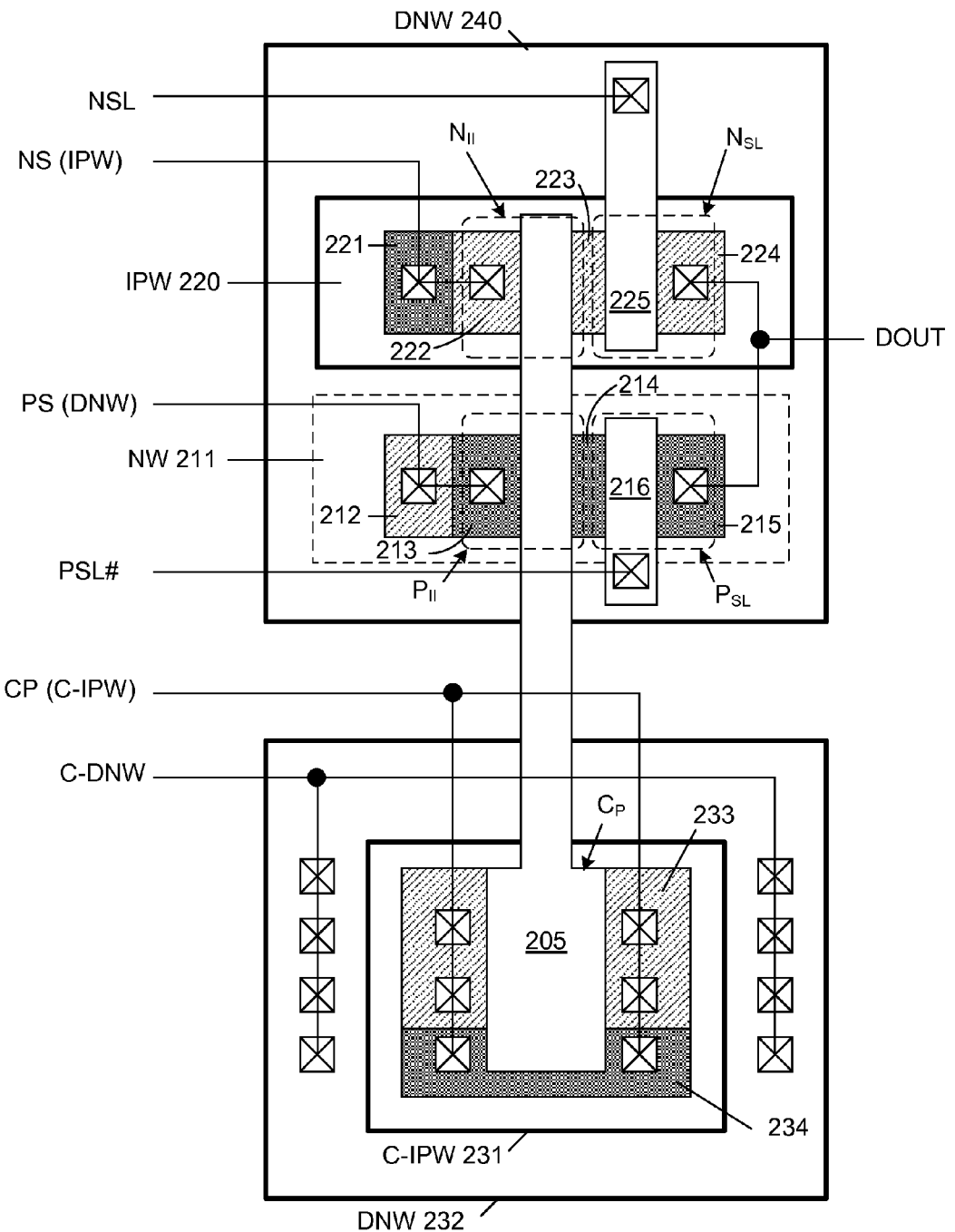
FIG. 2C is a top layout view of the memory cell of FIGS. 2A and 2B in accordance with one embodiment of the present invention.

FIG. 2C is a top layout view of memory cell 200 in accordance with one embodiment of the present invention. Similar elements are labeled with similar reference numbers in FIGS. 2A-2C. Contact elements, which connect various layers within memory cell 200, are illustrated as boxes containing X's in FIG. 2C.

Figure 2D:
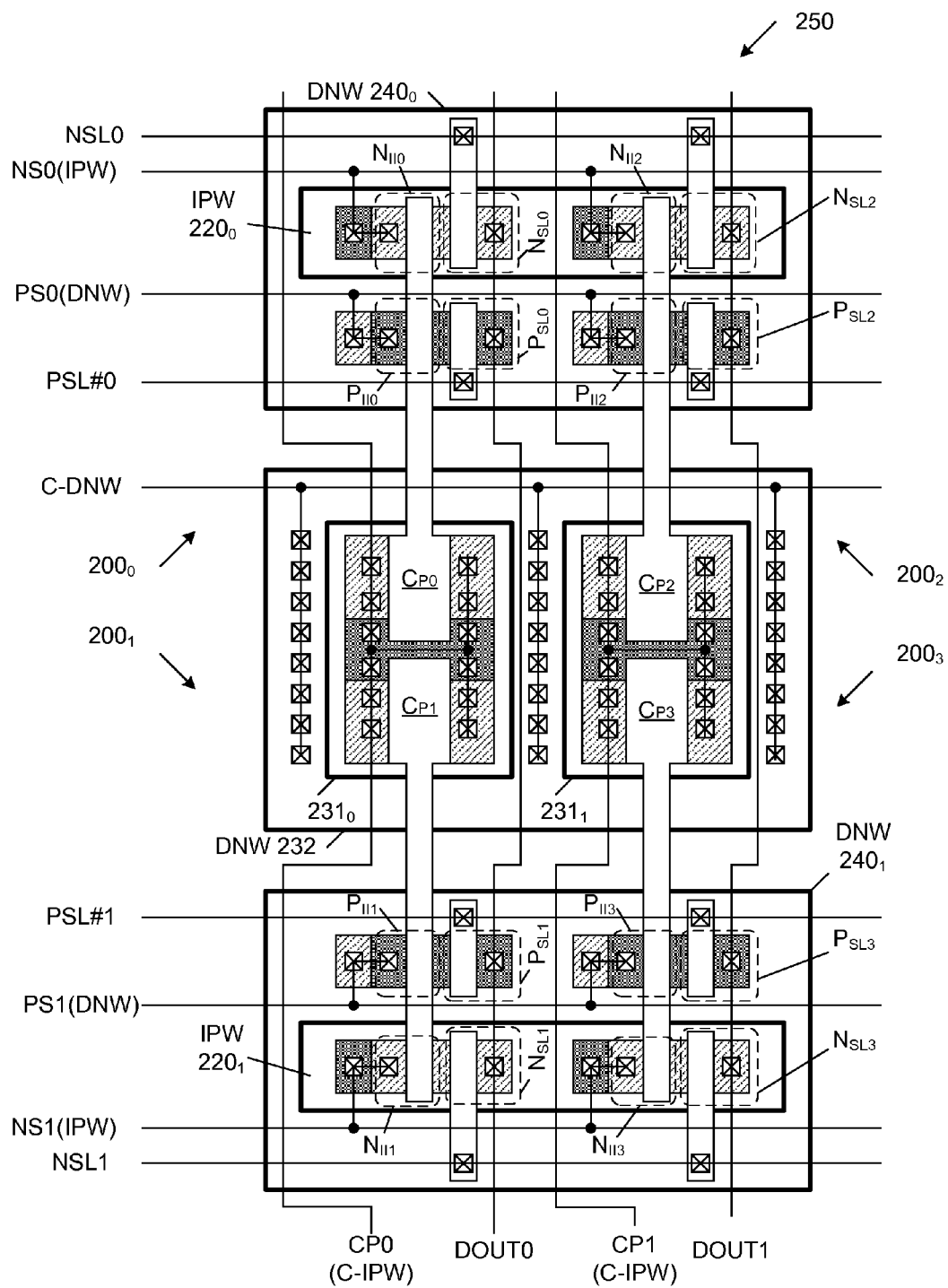
FIG. 2D is a top layout view of a 2×2 array of memory cells, each of which is substantially identical to the memory cells of FIGS. 2A-2C, in accordance with one embodiment of the present invention.

FIG. 2D is a top layout view of four memory cells $200_0$-$200_3$, which form a 2×2 array 250 in accordance with one embodiment of the present invention. Memory cells $200_0$, $200_1$, $200_2$ and $200_3$ include control capacitors $C_{P0}$, $C_{P1}$, $C_{P2}$ and $C_{P3}$, respectively, PMOS pull-up transistors $P_{II0}$, $P_{II1}$, $P_{II2}$ and $P_{II3}$, respectively, NMOS pull-down transistors $N_{II0}$, $N_{II1}$, $N_{II2}$ and $N_{II3}$, respectively, PMOS select transistors $P_{SL0}$, $P_{SL1}$, $P_{sL2}$ and $P_{SL3}$, respectively, and NMOS select transistors $N_{SL0}$, $N_{SL1}$, $N_{SL2}$ and $N_{SL3}$, respectively.

Memory cells $200_0$ and $200_2$ are substantially identical to memory cell 200 of FIG. 2C, with differences noted below. Memory cells $200_0$ and $200_2$ are horizontally adjacent to one another, and form a first row of array 250. The NMOS and PMOS transistors of memory cells $200_0$ and $200_2$ share the same deep n-well $240_0$. The NMOS transistors of memory cells $200_0$ and $200_2$ share the same isolated p-well $220_0$.

Each of the memory cells $200_1$ and $200_3$ is a mirror image of the memory cell 200 of FIG. 2C. Memory cells $200_1$ and $200_3$ are horizontally adjacent to one another, and form a second row of the array 250. The NMOS and PMOS transistors of memory cells $200_1$ and $200_3$ share the same deep n-well $240_1$. The NMOS transistors of memory cells $200_1$ and $200_3$ share the same isolated p-well $220_1$. The control capacitors $C_{P0}$-$C_{P3}$ of memory cells $200_0$-$200_3$ all share the same deep n-well 232. Control capacitors $C_{P0}$ and $C_{P1}$ share the same isolated p-well $231_0$, and control capacitors $C_{P1}$ and $C_{P3}$ share the same isolated p-well $231_1$.

The layout of the memory cells $200_0$-$200_3$ within array 250 results in an array having a relatively small layout area. In accordance with one embodiment, the memory cells $200_0$-$200_3$ can be fabricated on a layout area of 7.2 um by 18 um using a conventional 0.18 micron CMOS logic process, thus resulting in a layout area of 7.2*18/4=32.4 $um^2$ per cell.

The control terminals associated with the first row of array are labeled with the suffix '0' (i.e., NSL0, NS0(IPW), PS0 (DNW), PSL#0), and the control terminals associated with the second row of array 250 are labeled with the suffix '1' (i.e., PSL#1, PS1(DNW), NS1(IPW), NSL1). The terminals associated with the first column of array 250 are labeled with the suffix '0' (i.e., CP0(C-IPW) and DOUT0), and the terminals associated with the second column of array 250 are labeled with the suffix '1' (i.e., CP1(C-IPW) and DOUT1).

Figure 2E:
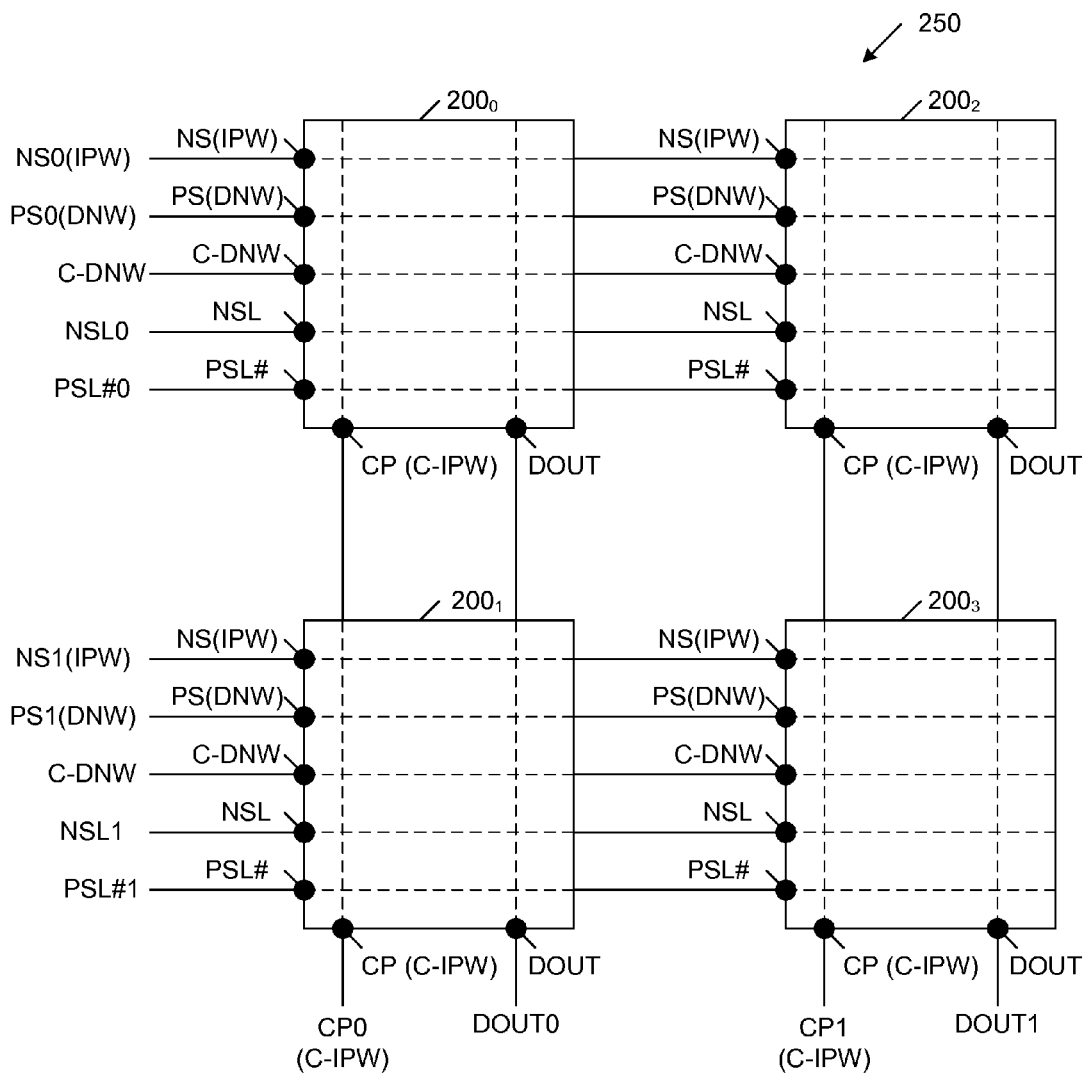
FIG. 2E is a block diagram of the 2×2 array of memory cells illustrated by FIG. 2D, in accordance with one embodiment of the present invention.

FIG. 2E is a block diagram that illustrates the 2×2 array 250 of FIG. 2D. Although a 2×2 array of memory cells is illustrated in FIGS. 2D and 2E, it is understood that arrays of other sizes could be implemented by extending the structure of FIGS. 2D and 2E. The array organization of FIGS. 2D-2E allows separate reading, programming and erase operations to be performed to each memory cell of the array 250. The isolated p-well regions of the control capacitors are merged in the manner illustrated in FIG. 2D to provide effective area utilization. The checkerboard-like orientation of memory cells allows compact positioning of output circuits 202 and CMOS inverters 201.

The array 250 of FIGS. 2D-2E operates as follows in accordance with one embodiment of the present invention. In the described examples, memory cell $200_0$ is selected for access, and memory cells $200_1$-$200_3$ are unselected. To eliminate disturb conditions within the unselected memory cells, intermediate voltages are applied to the terminals of the unselected memory cells in the manner described in more detail below.

Figure 2F:
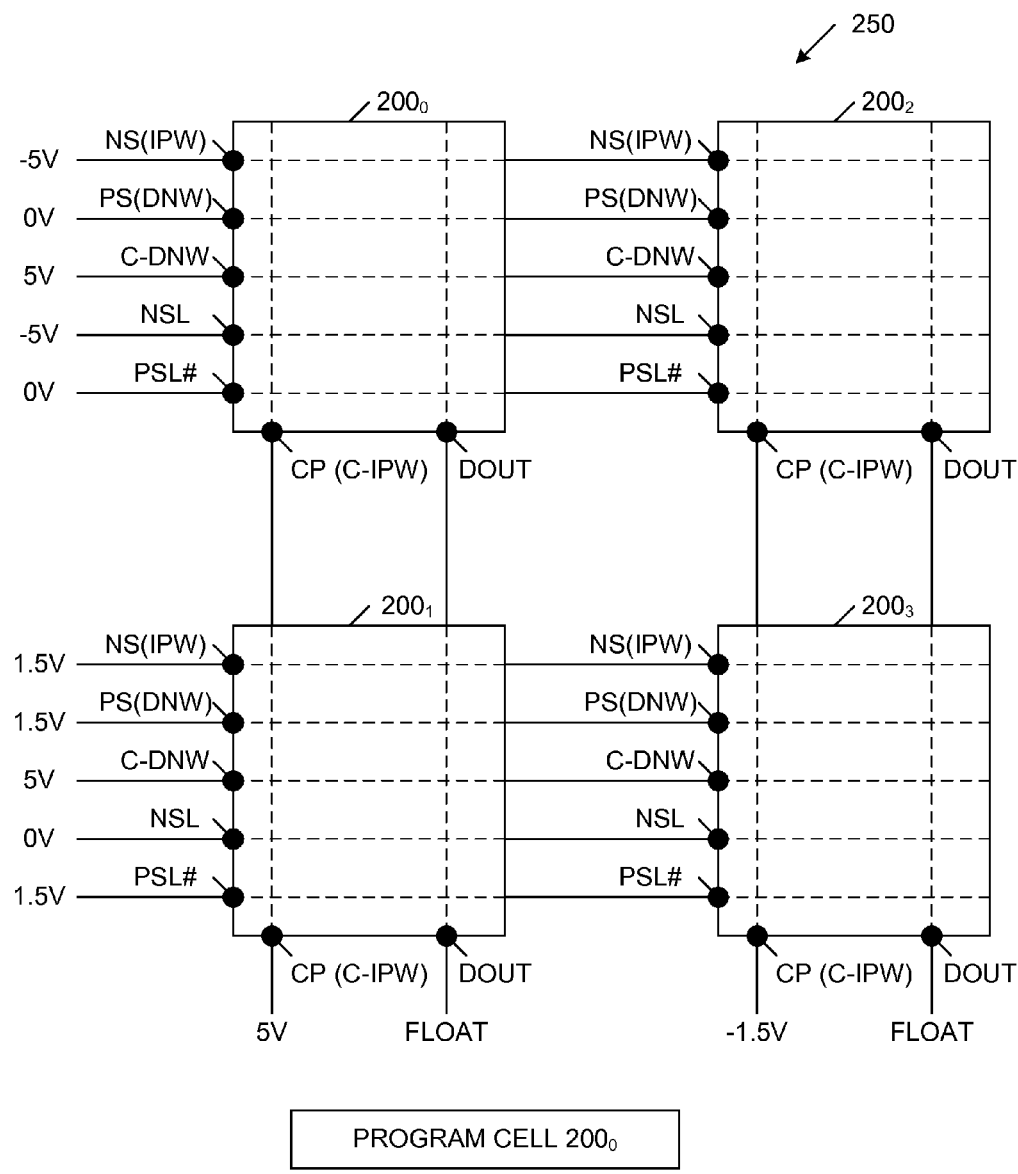
FIG. 2F is a block diagram that illustrates the programming of a selected memory cell within the array of FIG. 2E in accordance with one embodiment of the present invention.

FIG. 2F illustrates the voltages applied to the various terminals of array 250 in order to program memory cell $200_0$. A 5 Volt programming voltage is applied to the control gates CP(C-IPW) and the associated deep n-wells C-DNW of memory cells $200_0$ and $200_1$ (i.e., CP0(C-IPW)=C-DNW=5V). A −5 Volt programming voltage is applied to isolated p-well region $220_0$, associated with memory cells $200_0$ and $200_2$, as well as to the sources of the NMOS pull-down transistors $N_{II0}$ and $N_{II2}$ located in this isolated p-well region (i.e., NS0(IPW)=−5V). The −5 Volt programming voltage is also applied to the gates of the NMOS select transistors $N_{SL0}$ and $N_{SL2}$ associated with memory cells $200_0$ and $200_2$ (i.e., NSL0=−5V).

An intermediate voltage of −1.5 Volts is applied to the control gates CP(C-IPW) of memory cells $200_2$ and $200_3$ (i.e., CP1(C-IPW)=−1.5V). An intermediate voltage of 1.5 Volts is applied to the NS(IPW), PS(DNW) and PSL# terminals of memory cells $200_1$ and $200_3$ in the second row of array 250 (i.e., NS1(IPW)=PS1(DNW)=PSL#1=1.5V). The output terminals DOUT of memory cells $200_0$-$200_3$ are maintained in a floating state (i.e., DOUT0 and DOUT1 are floating). The remaining terminals of memory cells $200_0$-$200_3$ are coupled to ground (0 Volts).

Under these conditions, Fowler-Nordheim (F-N) tunneling occurs within memory cell $200_0$ in response to the 10 Volt difference between the control gate $C_{P0}$ and the isolated p-well region $220_0$ within this cell. More specifically, the F-N injection of electrons is induced in the NMOS transistor $N_{II0}$ from the isolated p-well region $220_0$ into floating gate 205 during the programming operation. Note that the NMOS transistor $N_{II0}$ in the isolated p-well region $220_0$ of memory cell $200_0$ has effectively replaced the tunnel capacitor $C_T$ of memory cell 100. As a result, the layout area of memory cell 200 may be significantly smaller than the layout area of memory cell 100.

Within memory cell $200_1$, the intermediate voltage of 1.5 Volts applied to the isolated p-well $220_1$ prevents the programming of this cell. That is, the 3.5 Volt difference between the control gate CG (5 V) and the isolated p-well $220_1$ (1.5 V) within memory cell $200_1$ significantly suppresses F-N tunneling.

Within memory cell $200_2$, the intermediate voltage of −1.5 Volts applied to the control gate CP(C-IPW) prevents the programming of this cell. That is, the 3.5 Volt difference between the control gate CG (−1.5 V) and the isolated p-well $220_0$ (−5 V) within memory cell $200_2$ significantly suppresses F-N tunneling.

Within memory cell $200_3$, the intermediate voltage of −1.5 Volts is applied to the control gate CP(C-IPW), and the intermediate voltage of 1.5 Volts is applied to the isolated p-well $220_1$. The 3.0 Volt difference between the control gate CG and the isolated p-well $220_1$ within memory cell $100_3$ is insufficient to cause F-N tunneling, thereby not causing the programming of this cell.

Figure 2G:
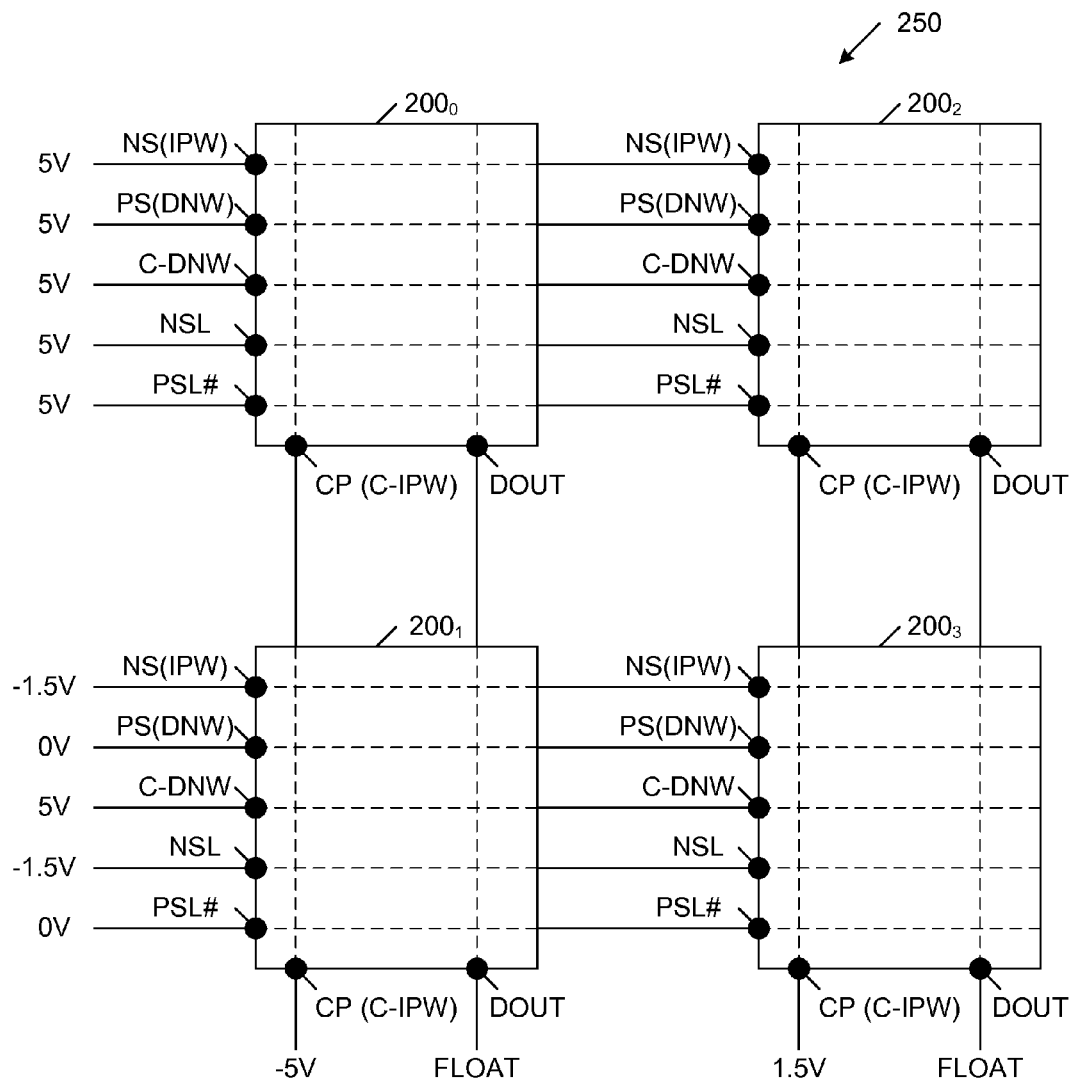
FIG. 2G is a block diagram that illustrates the erasing of a selected memory cell within the array of FIG. 2E in accordance with one embodiment of the present invention.

FIG. 2G illustrates the voltages applied to the various terminals of array 250 in order to erase memory cell $200_0$. A −5 Volt erase voltage is applied to the control gates CP(C-IPW) of memory cells $200_0$ and $200_1$ (i.e., CP0(C-IPW)=−5V). A 5 Volt erase voltage is applied to the NS(IPW), PS(DNW), NSL and PSL# terminals of memory cells $200_0$ and $200_2$ (i.e., NS0(IPW)=PS0(DNW)=NSL=PSL#0=5V). The 5 Volt erase voltage is also applied to the C-DNW terminals of memory cells $200_0$-$200_3$. An intermediate voltage of −1.5 Volts is applied to the NS(IPW) and NSL terminals of memory cells $200_1$ and $200_3$ (i.e., NS1(IPW)=NSL1=−1.5V). An intermediate voltage of 1.5 Volts is applied to the CP(C-IPW) terminals of memory cells $200_2$ and $200_3$ (i.e., CP1(IPW)=1.5V). The output terminals DOUT of memory cells $200_0$-$200_3$ are maintained in a floating state (i.e., DOUT0 and DOUT1 are floating). The remaining terminals of memory cells $200_0$-$200_3$ are coupled to ground (0 Volts).

Under these conditions, Fowler-Nordheim (F-N) tunneling of electrons occurs within memory cell $200_0$ in response to the 10 Volt difference between the control gate CP(C-IPW) and the isolated p-well $220_0$ within this cell. More specifically, electrons are removed from the floating gate of memory cell $200_0$ by F-N injection during the erase operation.

F-N tunneling also occurs within memory cell $200_0$ in response to the 10 Volt difference between the PS(DNW) terminal and the control gate CP(C-IPW). More specifically, electrons are removed from the floating gate of memory cell $200_0$ by F-N injection during the erase operation.

Within memory cell $200_1$, the intermediate voltage of −1.5 Volts applied to the NS(IPW) terminal (i.e., isolated p-well $220_1$) prevents the erasing of this cell. That is, the 3.5 Volt difference between the control gate CP(C-IPW) (−5 V) and the isolated p-well $220_1$ (−1.5V) within memory cell $200_1$ is insufficient to cause F-N tunneling.

Within memory cell $200_2$, the intermediate voltage of 1.5 Volts applied to the control capacitor CP(C-IPW) prevents the erasing of this cell. That is, the 3.5 Volt difference between the control gate CP(C-IPW) (1.5 V) and the isolated p-well $220_0$ (5 V) within memory cell $200_2$ is insufficient to cause F-N tunneling.

Within memory cell $200_3$, the intermediate voltage of −1.5 Volts applied to the NS(IPW) terminal and the intermediate voltage of 1.5 Volts applied to the control capacitor terminal CP(C-IPW) is insufficient to erase this cell. That is the 3.0 volt difference between the control gate CP(C-IPW) (1.5 V) and the isolated p-well $220_1$ (−1.5 V) is insufficient to cause F-N tunneling.

Although the program and erase operations have been described in connection with voltages of 5V and −5V, which create a 10V difference between the control gate CP(C-IPW) and the isolated p-well of the NMOS transistor $P_{II}$ (i.e., NS(IPW)) of the memory cell being programmed/erased, it is understood that this 10V difference could be introduced in other manners in other embodiments. For example, a 10 Volt signal could be applied to the control gate CP(C-IPW) and a 0 Volt signal could be applied to the isolated p-well NS(IPW) to perform a program operation. Conversely, a 10 Volt signal could be applied to the isolated p-well NS(IPW) and a 10 Volt signal could be applied to the control gate CP(C-IPW) to perform an erase operation. Alternately, a −10 Volt signal could be applied to the control gate CP(C-IPW) and a 0 Volt signal could be applied to the isolated p-well NS(IPW) to perform an erase operation.

The structure of memory cell 200 allows the sensing of the state of the memory cell to be performed in several ways. First, a CMOS inverter logic readout can be performed by turning on both the PMOS select transistor $P_{SL}$ and the NMOS select transistor $N_{SL}$, and sensing the voltage on the output terminal DOUT. Second, the PMOS select transistor $P_{SL}$ can be turned off, and the NMOS select transistor $N_{SL}$ can be turned on, and the current flowing through the NMOS select transistor $N_{SL}$ and the NMOS pull-down transistor $N_{II}$ can be sensed at the output terminal DOUT. Alternately, the NMOS select transistor $N_{SL}$ can be turned off, and the PMOS select transistor $P_{SL}$ can be turned on, and the current flowing through the PMOS select transistor $P_{SL}$ and the PMOS pull-down transistor $P_{II}$ can be sensed at the output terminal DOUT. This allows flexibility in the design of memory arrays that utilize the proposed memory cell 200, so that either logic or analog read-out can be implemented. Table 4 below illustrates the voltages applied to the various terminals of memory cell 200 in order to perform an inverter logic readout, an analog readout through NMOS select transistor $N_{SL}$, and an analog readout through PMOS select transistor $P_{SL}$. In the described embodiment, the positive supply voltage $V_{DD}$ can be, for example, 3.3 Volts.

TABLE 4

READING SCHEMES FOR MEMORY CELL 200

| | NS(IPW) | PS(DNW) | C-DNW | NSL | PSL# | CP(C-IPC) | DOUT |
|---|---|---|---|---|---|---|---|
| Logic Read | 0 | $V_{DD}$ | $V_{DD}$ | $V_{DD}$ | 0 | $V_{DD}$ | To input of logic circuit |

TABLE 4-continued

READING SCHEMES FOR MEMORY CELL 200

| | NS(IPW) | PS(DNW) | C-DNW | NSL | PSL# | CP(C-IPC) | DOUT |
|---|---|---|---|---|---|---|---|
| Analog Read through $N_{SL}$ | 0 | $V_{DD}$ | $V_{DD}$ | $V_{DD}$ | $V_{DD}$ | $V_{DD}$ | To input of sense amplifier for current sensing |
| Analog Read through $P_{SL}$ | 0 | $V_{DD}$ | $V_{DD}$ | 0 | 0 | $V_{DD}$ | To input of sense amplifier for current sensing |

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A non-volatile memory cell comprising:
a control capacitor;
an inverter comprising a first inverter transistor and a second inverter transistor, wherein the control capacitor, the first inverter transistor and the second inverter transistor share a floating gate;
an output circuit comprising a first output transistor and a second output transistor, wherein the first output transistor and the first inverter transistor share a first common source/drain region, and the second output transistor and the second inverter transistor share a second common source/drain region.

2. The non-volatile memory cell of claim 1, wherein the first source/drain region is isolated from the second source/drain region.

3. The non-volatile memory cell of claim 1, wherein the first inverter transistor and the first output transistor are fabricated in a first well region having a first conductivity type.

4. The non-volatile memory cell of claim 3, wherein the second inverter transistor and the second output transistor are fabricated in a second well region having a second conductivity type, opposite the first conductivity type.

5. The non-volatile memory cell of claim 4, wherein the first well region and the second well region are located in a first deep well region having the first conductivity type.

6. The non-volatile memory cell of claim 1, further comprising a read output terminal coupled to a drain region of the first output transistor and a drain region of the second output transistor.

7. The non-volatile memory cell of claim 1, wherein the floating gate forms an electrode of the control capacitor, and wherein the control capacitor further comprises a first well region having a first conductivity type that forms a counter electrode of the control capacitor.

8. The non-volatile memory cell of claim 7, further comprising a first deep well region having a second conductivity type, opposite the first conductivity type, wherein the first well region is located in the first deep well region.

9. The non-volatile memory cell of claim 7, further comprising a tunnel capacitor, wherein the floating gate forms an electrode of the tunnel capacitor, and wherein the tunnel capacitor further comprises a second well region that forms a counter electrode of the tunnel capacitor, the second well region having the first conductivity type.

10. The non-volatile memory cell of claim 9, further comprising:
a first deep well region having a second conductivity type, opposite the first conductivity type, wherein the first well region is located in the first deep well region; and
a second deep well region having the second conductivity type, wherein the second well region is located in the second deep well region.

11. The non-volatile memory cell of claim 1, further comprising programming means for inducing Fowler-Nordheim (F-N) tunneling between the second inverter transistor and the floating gate.

12. The non-volatile memory cell of claim 11, further comprising erase means for inducing F-N tunneling between the first and second inverter transistors and the floating gate.

13. The non-volatile memory cell of claim 1, wherein:
the first inverter transistor includes a source coupled to receive a first voltage and a drain coupled to a source of the first output transistor; and
the second inverter transistor includes a source coupled to receive a second voltage, different than the first voltage, and a drain coupled to a source of the second output transistor.

14. The non-volatile memory cell of claim 13, wherein the drain of the first inverter transistor is electrically isolated from the drain of the second inverter transistor.

15. The non-volatile memory cell of claim 13, further comprising an output terminal coupled to a drain of the first output transistor and a drain of the second output transistor.

16. The non-volatile memory cell of claim 13, wherein the drain of the first inverter transistor is continuous with the source of the first output transistor, and the drain of the second inverter transistor is continuous with the source of the second output transistor.

17. An array of non-volatile memory cells comprising:
a first plurality of non-volatile memory cells that form a first row of the array, wherein each of the first plurality of non-volatile memory cells includes:
a control capacitor having a corresponding floating gate electrode;
an inverter that shares the floating gate electrode with the control capacitor; and
an output circuit coupled to the inverter;
wherein each control capacitor in the first row of the array shares a common first well region which forms a counter-electrode of the control capacitors in the first row.

18. The array of claim 17, wherein the first well region is located in a first deep well region having a conductivity type different than a conductivity type of the first well region.

19. The array of claim 17, further comprising:
a second plurality of non-volatile memory cells that form a second row of the array, wherein each of the second plurality of non-volatile memory cells includes:
- a control capacitor having a corresponding floating gate electrode;
- an inverter that shares the floating gate electrode with the control capacitor; and
- an output circuit coupled to the inverter;

wherein each control capacitor in the second row of the array shares a common second well region which forms a counter-electrode of the control capacitors in the second row.

20. The array of claim 19, wherein each inverter includes a first PMOS inverter transistor, and each output circuit includes a first PMOS output transistor, wherein each first PMOS inverter transistor and each first PMOS output transistor is fabricated in a common n-well.

21. The array of claim 17, wherein each inverter circuit comprises a first inverter transistor and a second inverter transistor, wherein the corresponding control capacitor, the first inverter transistor and the second inverter transistor share the corresponding floating gate electrode, and wherein each output circuit comprises a first output transistor and a second output transistor, wherein the first output transistor and the first inverter transistor share a first common source/drain region, and the second output transistor and the second inverter transistor share a second common source/drain region.

\* \* \* \* \*